(12) United States Patent
Miles et al.

(10) Patent No.: US 9,181,086 B1
(45) Date of Patent: Nov. 10, 2015

(54) HINGED MEMS DIAPHRAGM AND METHOD OF MANUFACTURE THEROF

(71) Applicants: Ronald N. Miles, Newark Valley, NY (US); Weili Cui, Vestal, NY (US)

(72) Inventors: Ronald N. Miles, Newark Valley, NY (US); Weili Cui, Vestal, NY (US)

(73) Assignee: The Research Foundation for The State University of New York, Binghamton, NY (US)

( * ) Notice: Subject to any disclaimer, the term of this patent is extended or adjusted under 35 U.S.C. 154(b) by 0 days.

(21) Appl. No.: 14/039,149

(22) Filed: Sep. 27, 2013

Related U.S. Application Data

(60) Provisional application No. 61/708,282, filed on Oct. 1, 2012.

(51) Int. Cl.
*H04R 19/04* (2006.01)
*B81C 1/00* (2006.01)
*B81B 3/00* (2006.01)

(52) U.S. Cl.
CPC ........... *B81C 1/00595* (2013.01); *B81B 3/0027* (2013.01); *B81B 2201/0257* (2013.01); *B81B 2203/0127* (2013.01)

(58) Field of Classification Search
CPC ............... B81B 2201/0257; B81B 7/0061; B81C 1/00158; H04R 19/005; H04R 19/04; H01L 2924/00; H01L 2924/1461
USPC ........................................... 257/416; 438/53
See application file for complete search history.

(56) References Cited

U.S. PATENT DOCUMENTS

| | | | |
|---|---|---|---|
| 5,573,679 A | 11/1996 | Mitchell et al. |
| 5,889,872 A | 3/1999 | Sooriakumar et al. |
| 6,035,714 A | 3/2000 | Yazdi et al. |
| 6,140,689 A | 10/2000 | Scheiter et al. |
| 6,167,757 B1 | 1/2001 | Yazdi et al. |
| 6,286,369 B1 | 9/2001 | Yazdi et al. |
| 6,402,968 B1 | 6/2002 | Yazdi et al. |
| 6,515,346 B1 | 2/2003 | Kemeny |
| 6,664,713 B2 | 12/2003 | Boesen |
| 6,667,189 B1 | 12/2003 | Wang et al. |
| 6,677,176 B2 | 1/2004 | Wong et al. |
| 6,781,231 B2 | 8/2004 | Minervini |
| 6,788,796 B1 | 9/2004 | Miles et al. |

(Continued)

OTHER PUBLICATIONS

Chan, Chun-Kai, et al. "Design and implementation of a capacitive-type microphone with rigid diaphragm and flexible spring using the two poly silicon micromachining processes." Sensors Journal, IEEE 11.10 (2011): 2365-2371.

(Continued)

*Primary Examiner* — Selim Ahmed
(74) *Attorney, Agent, or Firm* — Steven M. Hoffberg, Esq.; Ostrolenk Faber LLP

(57) ABSTRACT

A micromechanical structure, comprising a substrate having a through hole; a residual portion of a sacrificial oxide layer peripheral to the hole; and a polysilicon layer overlying the hole, patterned to have a planar portion; a supporting portion connecting the planar portion to polysilicon on the residual portion; polysilicon stiffeners formed extending beneath the planar portion overlying the hole; and polysilicon ribs surrounding the supporting portion, attached near a periphery of the planar portion. The polysilicon ribs extend to a depth beyond the stiffeners, and extend laterally beyond an edge of the planar portion. The polysilicon ribs are released from the substrate during manufacturing after the planar region, and reduce stress on the supporting portion.

24 Claims, 9 Drawing Sheets

Buffered Hydrofluoric Acid Release

(56) References Cited

U.S. PATENT DOCUMENTS

| | | | |
|---|---|---|---|
| 6,963,653 B1 | 11/2005 | Miles |
| 6,967,362 B2 | 11/2005 | Nam et al. |
| 7,041,225 B2 | 5/2006 | Lutz |
| 7,092,539 B2 | 8/2006 | Sheplak et al. |
| 7,132,307 B2 | 11/2006 | Wang et al. |
| 7,146,014 B2 | 12/2006 | Hannah |
| 7,146,016 B2 | 12/2006 | Pedersen |
| 7,166,910 B2 | 1/2007 | Minervini |
| 7,190,038 B2 | 3/2007 | Dehe et al. |
| 7,192,819 B1 | 3/2007 | Padmanabhan et al. |
| 7,242,089 B2 | 7/2007 | Minervini |
| 7,301,212 B1 | 11/2007 | Mian et al. |
| 7,317,234 B2 | 1/2008 | Marsh et al. |
| 7,318,349 B2 | 1/2008 | Vaganov et al. |
| 7,329,933 B2 | 2/2008 | Zhe et al. |
| 7,358,151 B2 | 4/2008 | Araki et al. |
| 7,381,589 B2 | 6/2008 | Minervini |
| 7,436,054 B2 | 10/2008 | Zhe |
| 7,439,616 B2 | 10/2008 | Minervini |
| 7,449,356 B2 | 11/2008 | Weigold |
| 7,469,461 B2 | 12/2008 | Chang et al. |
| 7,471,798 B2 | 12/2008 | Warren |
| 7,473,572 B2 | 1/2009 | Dehe et al. |
| 7,520,173 B2 | 4/2009 | Lee et al. |
| 7,537,964 B2 | 5/2009 | Minervini |
| 7,542,580 B2 | 6/2009 | Burns |
| 7,545,945 B2 | 6/2009 | Miles |
| 7,569,906 B2 | 8/2009 | Mori et al. |
| 7,615,834 B2 | 11/2009 | Khuri-Yakub et al. |
| 7,633,131 B1 | 12/2009 | Padmanabhan et al. |
| 7,642,575 B2 | 1/2010 | Wong et al. |
| 7,724,417 B2 | 5/2010 | Lewis et al. |
| 7,795,695 B2 | 9/2010 | Weigold et al. |
| 7,808,060 B2 | 10/2010 | Hsiao |
| 7,808,640 B2 | 10/2010 | Fritz et al. |
| 7,812,418 B2 | 10/2010 | Hsu et al. |
| 7,825,484 B2 | 11/2010 | Martin et al. |
| 7,826,629 B2 | 11/2010 | Miles et al. |
| 7,829,961 B2 | 11/2010 | Hsiao |
| 7,851,247 B2 | 12/2010 | Shih |
| 7,855,095 B2 | 12/2010 | Miyashita et al. |
| 7,868,402 B2 | 1/2011 | Huang et al. |
| 7,876,924 B1 | 1/2011 | Miles et al. |
| 7,903,835 B2 | 3/2011 | Miles |
| 7,923,791 B2 | 4/2011 | Huang et al. |
| 7,929,714 B2 | 4/2011 | Bazarjani et al. |
| 7,932,117 B2 | 4/2011 | Ueya |
| 7,933,428 B2 | 4/2011 | Sawada |
| 7,992,283 B2 | 8/2011 | Miles |
| 8,005,242 B2 | 8/2011 | Hsu et al. |
| 8,018,049 B2 | 9/2011 | Minervini |
| 8,041,064 B2 | 10/2011 | Kimura |
| 8,045,733 B2 | 10/2011 | Zhe et al. |
| 8,063,458 B2 | 11/2011 | Loeffler et al. |
| 8,071,412 B2 | 12/2011 | Shih |
| 8,072,010 B2 | 12/2011 | Lutz |
| 8,072,036 B2 | 12/2011 | Shih |
| 8,073,167 B2 | 12/2011 | Miles |
| 8,076,737 B2 | 12/2011 | Youngner |
| 8,094,846 B2 | 1/2012 | Hovesten et al. |
| 8,098,870 B2 | 1/2012 | Kok et al. |
| 8,102,015 B2 | 1/2012 | Gong et al. |
| 8,111,871 B2 | 2/2012 | Zhang et al. |
| 8,114,697 B2 | 2/2012 | Kim et al. |
| 8,114,700 B2 | 2/2012 | Miyashita et al. |
| 8,121,315 B2 | 2/2012 | Song et al. |
| 8,121,331 B2 | 2/2012 | Minervini |
| 8,129,803 B2 | 3/2012 | Martin et al. |
| 8,131,006 B2 | 3/2012 | Martin |
| 8,158,492 B2 | 4/2012 | Liu et al. |
| 8,165,323 B2 | 4/2012 | Zhou |
| 8,169,042 B2 | 5/2012 | Weigold et al. |
| 8,184,845 B2 | 5/2012 | Leidl et al. |
| 8,193,596 B2 | 6/2012 | Lee et al. |
| 8,194,896 B2 | 6/2012 | Hsiao |
| 8,199,963 B2 | 6/2012 | Schrank |
| 8,207,585 B2 | 6/2012 | Schlosser et al. |
| 8,208,662 B2 | 6/2012 | Chen |
| 8,208,671 B2 | 6/2012 | Chen et al. |
| 8,258,591 B2 | 9/2012 | Lee et al. |
| 8,304,846 B2 | 11/2012 | Shih |
| 8,309,386 B2 | 11/2012 | Weigold |
| 8,331,589 B2 | 12/2012 | Wu et al. |
| 8,338,898 B2 | 12/2012 | Schrank et al. |
| 8,351,634 B2 | 1/2013 | Khenkin |
| 8,351,635 B2 | 1/2013 | Sun et al. |
| 8,358,004 B2 | 1/2013 | Minervini |
| 8,363,859 B2 | 1/2013 | Chen |
| 8,368,153 B2 | 2/2013 | Huang et al. |
| 8,375,560 B2 | 2/2013 | Tsai et al. |
| 8,422,702 B2 | 4/2013 | Kim et al. |
| 8,428,286 B2 | 4/2013 | Fueldner et al. |
| 8,436,435 B2 | 5/2013 | Chan et al. |
| 8,438,710 B2 | 5/2013 | Li |
| 8,477,983 B2 | 7/2013 | Weigold et al. |
| 8,519,492 B2 | 8/2013 | Song |
| 8,524,519 B2 | 9/2013 | Wang et al. |
| 8,530,981 B2 | 9/2013 | Huckabee et al. |
| 8,536,666 B2 | 9/2013 | Shih |
| 8,569,850 B2 | 10/2013 | Kok et al. |
| 8,571,249 B2 | 10/2013 | Wang |
| 8,575,037 B2 | 11/2013 | Friza et al. |
| 8,590,136 B2 | 11/2013 | Yang et al. |
| 8,605,920 B2 | 12/2013 | Kim et al. |
| 8,617,934 B1 | 12/2013 | Minervini |
| 8,617,960 B2 | 12/2013 | Denison et al. |
| 8,618,619 B1 | 12/2013 | Miks et al. |
| 8,623,709 B1 | 1/2014 | Minervini |
| 8,623,710 B1 | 1/2014 | Minervini |
| 8,624,384 B1 | 1/2014 | Minervini |
| 8,624,385 B1 | 1/2014 | Minervini |
| 8,624,386 B1 | 1/2014 | Minervini |
| 8,624,387 B1 | 1/2014 | Minervini |
| 8,629,005 B1 | 1/2014 | Minervini |
| 8,629,011 B2 | 1/2014 | Diamond et al. |
| 8,629,551 B1 | 1/2014 | Minervini |
| 8,629,552 B1 | 1/2014 | Minervini |
| 8,633,064 B1 | 1/2014 | Minervini |
| 8,637,945 B2 | 1/2014 | Reichenbach et al. |
| 8,652,883 B1 | 2/2014 | Minervini |
| 8,664,733 B2 | 3/2014 | Rombach |
| 8,687,827 B2 | 4/2014 | Chen et al. |
| 8,697,470 B2 | 4/2014 | Wang |
| 8,698,255 B2 | 4/2014 | Reichenbach et al. |
| 8,704,360 B1 | 4/2014 | Minervini |
| 8,713,789 B2 | 5/2014 | Leidl et al. |
| 8,765,530 B1 | 7/2014 | Minervini |
| 8,796,790 B2 | 8/2014 | Yang |
| 8,809,973 B2 | 8/2014 | Theuss |
| 8,816,454 B2 | 8/2014 | Zoellin et al. |
| 8,823,115 B2 | 9/2014 | Inoda et al. |
| 8,824,707 B2 | 9/2014 | Bachman et al. |
| 8,828,771 B2 | 9/2014 | Wang |
| 8,828,773 B2 | 9/2014 | Weigold |
| 8,841,738 B2 | 9/2014 | Harney et al. |
| 8,847,289 B2 | 9/2014 | Wang |
| 8,855,337 B2 | 10/2014 | van Lippen et al. |
| 8,860,154 B2 | 10/2014 | Wang |
| 8,865,499 B2 | 10/2014 | Pahl et al. |
| 8,865,500 B2 | 10/2014 | Huang et al. |
| 8,890,265 B2 | 11/2014 | Kuratani |
| 8,901,682 B2 | 12/2014 | Reimann et al. |
| 8,901,683 B2 | 12/2014 | Je |
| 2002/0149070 A1 | 10/2002 | Sheplak et al. |
| 2002/0151100 A1 | 10/2002 | Coffa et al. |
| 2003/0103638 A1 | 6/2003 | Boesen |
| 2003/0137021 A1 | 7/2003 | Wong et al. |
| 2004/0113153 A1 | 6/2004 | Wong et al. |
| 2004/0259286 A1 | 12/2004 | Dehe et al. |
| 2006/0134904 A1 | 6/2006 | Araki et al. |
| 2006/0141656 A1 | 6/2006 | Dehe et al. |
| 2006/0237806 A1 | 10/2006 | Martin et al. |
| 2007/0065968 A1 | 3/2007 | Kok et al. |
| 2007/0082421 A1 | 4/2007 | Minervini |

(56) References Cited

U.S. PATENT DOCUMENTS

| | | |
|---|---|---|
| 2007/0087466 A1 | 4/2007 | Weigold et al. |
| 2007/0092983 A1 | 4/2007 | Weigold |
| 2007/0134839 A1 | 6/2007 | Chang et al. |
| 2007/0202627 A1 | 8/2007 | Minervini |
| 2007/0205492 A1 | 9/2007 | Wang |
| 2007/0215964 A1 | 9/2007 | Khuri-Yakub et al. |
| 2007/0272992 A1 | 11/2007 | Mori et al. |
| 2007/0284682 A1 | 12/2007 | Laming et al. |
| 2008/0083960 A1 | 4/2008 | Chen et al. |
| 2008/0121947 A1 | 5/2008 | Frahm et al. |
| 2008/0152171 A1 | 6/2008 | Hovesten et al. |
| 2008/0157129 A1 | 7/2008 | Hsu et al. |
| 2008/0157238 A1 | 7/2008 | Hsiao |
| 2008/0164545 A1 | 7/2008 | Hsiao |
| 2008/0185669 A1 | 8/2008 | Kok et al. |
| 2008/0283942 A1 | 11/2008 | Huang et al. |
| 2008/0283943 A1 | 11/2008 | Dekker et al. |
| 2008/0283988 A1 | 11/2008 | Huang et al. |
| 2009/0014819 A1 | 1/2009 | Loeffler et al. |
| 2009/0029501 A1 | 1/2009 | Weigold |
| 2009/0041270 A1 | 2/2009 | Schrank et al. |
| 2009/0129612 A1 | 5/2009 | Takeuchi et al. |
| 2009/0130783 A1 | 5/2009 | Miyashita et al. |
| 2009/0179233 A1 | 7/2009 | Lee et al. |
| 2009/0180647 A1 | 7/2009 | Chen et al. |
| 2009/0202089 A1 | 8/2009 | Zhang et al. |
| 2009/0232336 A1 | 9/2009 | Pahl |
| 2009/0243058 A1 | 10/2009 | Shirasaka |
| 2009/0243060 A1 | 10/2009 | Saitoh |
| 2009/0262958 A1 | 10/2009 | Miles |
| 2009/0268926 A1 | 10/2009 | Watanabe |
| 2010/0052082 A1 | 3/2010 | Lee et al. |
| 2010/0065931 A1 | 3/2010 | Shih |
| 2010/0096711 A1 | 4/2010 | Tian |
| 2010/0155863 A1 | 6/2010 | Weekamp |
| 2010/0155864 A1 | 6/2010 | Laming et al. |
| 2010/0158281 A1 | 6/2010 | Lee et al. |
| 2010/0164025 A1 | 7/2010 | Yang |
| 2010/0193885 A1 | 8/2010 | Choo et al. |
| 2010/0270631 A1 | 10/2010 | Renner |
| 2010/0276767 A1 | 11/2010 | Liu et al. |
| 2010/0285628 A1 | 11/2010 | Martin et al. |
| 2010/0289097 A1 | 11/2010 | Weigold et al. |
| 2011/0013787 A1 | 1/2011 | Chang |
| 2011/0024851 A1 | 2/2011 | Shih |
| 2011/0027929 A1 | 2/2011 | Shih |
| 2011/0038493 A1 | 2/2011 | Li |
| 2011/0045616 A1 | 2/2011 | Miyashita et al. |
| 2011/0073967 A1 | 3/2011 | Chen et al. |
| 2011/0075875 A1 | 3/2011 | Wu et al. |
| 2011/0127623 A1 | 6/2011 | Fueldner et al. |
| 2011/0156176 A1 | 6/2011 | Huckabee et al. |
| 2011/0156179 A1 | 6/2011 | Shih |
| 2011/0158439 A1 | 6/2011 | Denison et al. |
| 2011/0165720 A1 | 7/2011 | Weigold |
| 2011/0189804 A1 | 8/2011 | Huang et al. |
| 2011/0198714 A1 | 8/2011 | Yang |
| 2011/0210409 A1 | 9/2011 | Minervini |
| 2011/0222717 A1 | 9/2011 | Kuratani et al. |
| 2011/0233692 A1 | 9/2011 | Inoda et al. |
| 2011/0248364 A1 | 10/2011 | Huang et al. |
| 2011/0266641 A1 | 11/2011 | Song |
| 2011/0272769 A1 | 11/2011 | Song et al. |
| 2011/0311081 A1 | 12/2011 | Kim |
| 2011/0316100 A1 | 12/2011 | Kim et al. |
| 2012/0025334 A1 | 2/2012 | Chan et al. |
| 2012/0033832 A1 | 2/2012 | van Lippen et al. |
| 2012/0043629 A1 | 2/2012 | Minervini |
| 2012/0087521 A1 | 4/2012 | Delaus et al. |
| 2012/0091544 A1 | 4/2012 | Reichenbach et al. |
| 2012/0091545 A1 | 4/2012 | Reichenbach et al. |
| 2012/0091546 A1 | 4/2012 | Langereis et al. |
| 2012/0139066 A1 | 6/2012 | Je et al. |
| 2012/0146163 A1 | 6/2012 | Ho et al. |
| 2012/0161257 A1 | 6/2012 | Friza et al. |
| 2012/0189143 A1 | 7/2012 | Buhmann et al. |
| 2012/0193735 A1 | 8/2012 | Chen |
| 2012/0205755 A1 | 8/2012 | Yueh |
| 2012/0237073 A1 | 9/2012 | Goida et al. |
| 2012/0250910 A1 | 10/2012 | Shajaan et al. |
| 2012/0261775 A1 | 10/2012 | Wang et al. |
| 2012/0319174 A1 | 12/2012 | Wang |
| 2012/0319219 A1 | 12/2012 | Diamond et al. |
| 2012/0326249 A1 | 12/2012 | Rombach |
| 2013/0010990 A1 | 1/2013 | Sridharan et al. |
| 2013/0056840 A1 | 3/2013 | Bominaar-Silkens et al. |
| 2013/0059409 A1 | 3/2013 | Wang |
| 2013/0065344 A1 | 3/2013 | Weigold |
| 2013/0069179 A1 | 3/2013 | Ishimoto et al. |
| 2013/0075835 A1 | 3/2013 | Chen et al. |
| 2013/0088941 A1 | 4/2013 | Elian et al. |
| 2013/0126990 A1 | 5/2013 | Wang |
| 2013/0140656 A1 | 6/2013 | Pahl et al. |
| 2013/0221456 A1 | 8/2013 | Li et al. |
| 2013/0244365 A1 | 9/2013 | Kim et al. |
| 2013/0320465 A1 | 12/2013 | Huang et al. |
| 2014/0001581 A1 | 1/2014 | Liu |
| 2014/0008740 A1 | 1/2014 | Wang et al. |
| 2014/0011313 A1 | 1/2014 | Huckabee et al. |
| 2014/0038335 A1 | 2/2014 | Merassi et al. |
| 2014/0070383 A1 | 3/2014 | Goida |
| 2014/0084394 A1 | 3/2014 | Je |
| 2014/0091406 A1 | 4/2014 | Harney et al. |
| 2014/0103464 A1 | 4/2014 | Bolognia et al. |
| 2014/0117473 A1 | 5/2014 | Kierse et al. |
| 2014/0145276 A1 | 5/2014 | Rombach |
| 2014/0175572 A1 | 6/2014 | Hsu et al. |
| 2014/0203380 A1 | 7/2014 | Theuss |
| 2014/0239352 A1 | 8/2014 | Wang |
| 2014/0264650 A1 | 9/2014 | Liu et al. |
| 2014/0264653 A1 | 9/2014 | Cheng et al. |
| 2014/0264654 A1 | 9/2014 | Salmon |
| 2014/0264662 A1 | 9/2014 | Cheng et al. |
| 2014/0312439 A1 | 10/2014 | Hoegerl et al. |
| 2014/0332912 A1 | 11/2014 | Theuss |
| 2014/0339657 A1 | 11/2014 | Grosh et al. |
| 2014/0346620 A1 | 11/2014 | Johansen et al. |

OTHER PUBLICATIONS

Fedder, Gary K. "MEMS fabrication." 2013 IEEE International Test Conference (ITC). IEEE Computer Society, 2003.

Cui, Weili, Ronald N. Miles, and Quang Su. "A robust miniature silicon microphone diaphragm." IFSA, Sensors & Transducers Journal (ISSN 1726-5479) 7 (2009): 63-77.

Nguyen, Clark T. "Micromachining technologies for miniaturized communication devices." Micromachining and Microfabrication. International Society for Optics and Photonics, 1998.

Gorecki, C. "Recent advances in silicon guided-wave MOEMS: from technology to applications." Optoelectronics Review 3 (2001): 248-256.

Cattin, Davide. Design, modelling and control of IRST capacitive MEMS microphone. Diss. University of Trento, 2009.

Maharbiz, Michel M., Christopher L. Muhlstein, and Olav Solgaard. "Micro and Nano Electromechanical Systems Chapter Editor: Roger T. Howe, Stanford, rthowe@ stanford. edu." (2006).

Logan, Andrew Stephan. The Design, Fabrication and Characterization of Capacitive Micromachined Ultrasonic Transducers for Imaging Applications Diss. University of Waterloo, 2010.

Jeelani, Mohammad Kamran. "Integration and characterization of micromachined optical microphones." (2009). Georgia Institute of Technology.

Ohji, Hiroshi. Macroporous silicon based micromachining. TU Delft, Delft University of Technology, 2002.

Scheeper, P. R., et al. "A review of silicon microphones." Sensors and Actuators A: Physical 44.1 (1994): 1-11.

Fuller, Dr Lynn. "Microelectromechanical Systems (MEMS) Applications—Microphones." Rochester Institute of Technology Microelectronic Engineering (2005): 1-43.

Ning, Y. B., A. W. Mitchell, and R. N. Tait. "Fabrication of a silicon micromachined capacitive microphone using a dry-etch process." Sensors and Actuators A: Physical 53.1 (1996): 237-242.

(56) References Cited

OTHER PUBLICATIONS

Pedersen, Michael, Wouter Olthuis, and Piet Bergveld. "A Silicon Condenser microphone with polyimide diaphragm and backplate." Sensors and Actuators A: Physical 63.2 (1997): 97-104.

Chen, Jing, et al. "Single-chip condenser miniature microphone with a high sensitive circular corrugated diaphragm." Micro Electro Mechanical Systems, 2002. The Fifteenth IEEE International Conference on. IEEE, 2002.

Dehé, Alfons, et al. "Silicon micromachined microphone chip at Siemens." 137th Regular Meeting of the Acoustical Society of America. 1999.

K. Yoo, C. Gibbons, Q. Su, R. Miles, and N. Tien, "Fabrication of biomimetic 3-D structured diaphragms", Sensors and Actuators A—Physical 97-8, 448-456 (2002), Transducers 2001 Conference/Eurosensor XVth Conference, Munich, Germany, Jun. 10-14, 2001.

L. Tan, R. Miles, M. Weinstein, R. Miller, Q. Su, W. Cui, and J. Gao, "Response of a biologically inspired NMMS differential microphone diaphragm", in Unattended Ground Sensor Technologies and Applications IV, edited by Carapezza, EM, vol. 4743 of Proceedings of the Society of Photo-Optical Instrumentation Engineers (SPIE), 91-98 (2002), Conference on Unattended Ground Sensor Technologies and Applications IV, Orlando, FL, Apr. 2-5, 2002.

R. Miles and R. Hoy, "The development of a biologically-inspired directional microphone for hearing aids", Audiology and Neuro-Otology 11, 86-94 (2006).

W. Cui, B. Bicen, N. Hall, S. Jones, F. Degertekin, and R. Miles, "Optical sensing in a directional MEMS microphone inspired by the ears of the parasitoid fly, Ormia ochracea", in MEMS 2006: 19th IEEE International Conference on Micro Electro Mechanical Systems, Technical Digest, Proceedings: IEEE Micro Electro Mechanical Systems Workshop, 614-617 (2006), 19th IEEE International Conference on Micro Electro Mechanical Systems (MEMS 2006), Istanbul, Turkey, Jan. 22-26, 2006.

B. Bicen, S. Jolly, K. Jeelani, C. T. Garcia, N. A. Hall, F. L. Degertekin, Q. Su, W. Cui, and R. N. Miles, "Integrated Optical Displacement Detection and Electrostatic Actuation for Directional Optical Microphones With Micromachined Biomimetic Diaphragms", IEEE Sensors Journal 9, 1933-1941 (2009).

W. Cui, R. N. Miles, and Q. Su, "The Design, Fabrication and Characterization of a Novel Miniature Silicon Microphone Diaphragm", in Nanotech Conference & Expo 2009, vol. 1, Technical Proceedings—Nanotechnology 2009: Fabrication, Particles, Characterization, MEMS, Electronics and Photonics, edited by Laudon, M and Romanowicz, B, 432-435 (2009), Nanotech 2009 Conference, Houston, TX, May 3-7, 2009.

R. N. Miles, Q. Su, W. Cui, M. Shetye, F. L. Degertekin, B. Bicen, C. Garcia, S. Jones, and N. Hall, "A low-noise differential microphone inspired by the ears of the parasitoid fly Ormia ochracea", Journal of the Acoustical Society of America 125, 2013-2026 (2009).

H. Xie, Y. Pan, and G. Fedder, "A CMOS-MEMS mirror with high curled-hinge comb drives", Microelectromechanical Systems, Journal of 12, 450-457 (2003).

A. Ferreira and S. Aphale, "A survey of modeling and control techniques for micro- and nanoelectromechanical systems", Systems, Man, and Cybernetics, Part C: Applications and Reviews, IEEE Transactions on 1-15 (2008).

F. Hu, Y. Tang, and Y. Qian, "Design of a mems micromirror actuated by electrostatic repulsive force", Optik-International Journal for Light and Electron Optics (2011).

S. Weber, L. Bonacina, W. Noell, D. Kiselev, J. Extermann, F. Jutzi, S. Lani, O. Nenadl, J. Wolf, and N. de Rooij, "Design, simulation, fabrication, packaging, and characterization of a mems-based mirror array for femtosecond pulse-shaping in phase and amplitude", Review of Scientific Instruments 82, 075106 (2011).

Y. Ma, S. Islam, and Y. Pan, "Electrostatic torsional micromirror with enhanced tilting angle using active control methods", Mechatronics, IEEE/ASME Transactions on 16, 994-1001 (2011).

D. Homentcovschi and R. Miles, "Modeling of viscous damping of perforated planar microstructures. Applications in acoustics", Journal of the Acoustical Society of America 116, 2939-2947 (2004).

D. Homentcovschi and R. Miles, "Viscous damping of perforated planar micromechanical structures", Sensors and Actuators A—Physical 119, 544-552 (2005).

D. Homentcovschi and R. N. Miles, "Viscous microstructural dampers with aligned holes: Design procedure including the edge correction", Journal of the Acoustical Society of America 122, 1556-1567 (2007).

D. Homentcovschi, W. Cui, and R. N. Miles, "Modelling of viscous squeeze-film damping and the edge correction for perforated microstructures having a special pattern of holes", in Proceedings of the ASME International Design Engineering Technical Conference and Information in Engineering Conference , vol. 1, PTS A-C, 1025-1033 (2008), ASME International Design Engineering Technical Conferences/Computers and Information in Engineering Conference, Las Vegas, NV, Sep. 4-7, 2007.

D. Homentcovschi and R. N. Miles, "Analytical model for viscous damping and the spring force for perforated planar microstructures acting at both audible and ultrasonic frequencies", Journal of the Acoustical Society of America 124, 175-181 (2008).

W. Cui, R. N. Miles, and D. Homentcovsci, "The effect of shape and distribution of perforations on squeeze-film damping in parallel plate capacitors", in ASME 2009 International Design Engineering Technical Conferences and Computers and Information in Engineering Conference (IDETC/CIE2009), 663-670 (2010), ASME International Design Engineering Technical Conferences/Computers and Information in Engineering Conference, San Diego, CA, Aug. 30-Sep. 2, 2009.

D. Homentcovschi and R. N. Miles, "Viscous damping and spring force in periodic perforated planar microstructures when the Reynolds' equation cannot be applied", Journal of the Acoustical Society of America 127, 1288-1299 (2010).

D. Homentcovschi, B. T. Murray, and R. N. Miles, "An analytical formula and FEM simulations for the viscous damping of a periodic perforated MEMS microstructure outside the lubrication approximation", Microfluidics and Nanofluidics 9, 865-879 (2010).

Cui, W. (2004). "Analysis, Desgin, and Fabrication of a Novel Silicon Microphone," Ph.D. Thesis, SUNY at Binghampton.

V. P. Jaecklin, C. Linder, N. F. de Rooij, and J.M. Moret, Micromechanical comb actuators with low driving voltage, J. Micromech. Microeng. 2 250-255, 1992.

Ki Bang Leea and Young-Ho Cho, A triangular electrostatic comb array for micromechanical resonant frequency tuning, Sensors and Actuators A: Physical vol. 70, Issues 1-2, Oct. 1, 1998, pp. 112-117.

Analog Devices, "ADXL05, +-1 g to +-5 g Single Chip Accelerometer with Signal Conditioning," Datasheet, 1995, Norwood, MA 02062.

Arjun Selvakumar, Farrokh Ayazi and Khalil Najafi, A High Sensitivity Z-Axis Torsional Silicon Accelerometer, Journal of Microelectromechanical Systems, Jun. 1998, vol. 7, Issue2, pp. 192-200.

Rob Legtenberg, A W Groeneveld and M Elwenspoek, Comb-drive actuators for large displacements, J. Micromech. Microeng. 6 320-329, 1996.

Yongjun Zhao, Tianhong Cui, Fabrication of high-aspect-ratio polymer-based electrostatic comb drives using the hot embossing technique, 2003 J. Micromech. Microeng. 13 430-435.

M. Steven Rodgers, et al., "A New Class of High Force, Low-Voltage, Compliant Actuation Systems," Solid State Sensor and Actuator Workshop, Hilton Head Island, South Carolina, Jun. 4-8, 2000.

Chen Yang-Che, Chang Ian Chao-Min, Rongshun Chen, Hou Max Ti-Kuang, On the side instability of comb-fingers in MEMS electrostatic devices, Sensors and actuators. A, Physical ISSN 0924-4247, vol. 148, No. 1, pp. 201-210, 2008.

B. Borovic, F. L. Lewis, A. Q. Liu, E. S. Kolesar, D. Popa, The lateral instability problem in electrostatic comb drive actuators: modeling and feedback control Export, Journal of Micromechanics and Microengineering, vol. 16, No. 7. (Jul. 2006), pp. 1233-1241.

Wei Huang, and Ganyu Lu, Analysis of lateral instability of in-plane comb drive MEMS actuators based on a two-dimensional model , Sensors and Actuators A: Physical vol. 113, Issue 1, Jun. 15, 2004, pp. 78-85.

(56) References Cited

OTHER PUBLICATIONS

Huikai Xie, and Gary K. Feddera, b, Vertical comb-finger capacitive actuation and sensing for CMOS-MEMS, Sensors and Actuators A: Physical vol. 95, Issues 2-3, Jan. 1, 2002, pp. 212-221.

Huikai Xie and Gary Fedder, A CMOS z-axis capacitive accelerometer with comb-finger sensing, Proceedings of the 13th IEEE International Conference on Micro Electro Mechanical Systems (MEMS '00), Jan. 2000, pp. 496-501.

Duck-Bong Seo, Robin Shandas, Design and simulation of a MEMS-based come-drive pressure sensor for pediatric post-operative monitoring applications, 2003 Summer Bioengineering Conference, Jun. 25-29, Sonesta Beach Resort in Key Biscayne, Florida.

A. Mason, M. Oshinsky, and R.R. Hoy, "Hyperacute directional hearing in a microscale auditory system," Nature, 410, pp. 686-690, 2001.

R. N. Miles, D. Robert, and R. R. Hoy, "Mechanically Coupled Ears for Directional Hearing in the Parasitoid Fly Ormia ochracea," Journal of the Acoustical Society of America , 98, pp. 3059-3070, 1995.

W. Cui, R. N. Miles, Q. Su, "A Robust Miniature Silicon Microphone diaphragm," IFSA, Sensors & Transducers Journal (ISSN 1726-5479), vol. 7, Special Issue "MEMS: From Micro Devices to Wireless Systems", Oct. 2009, pp. 63-77.

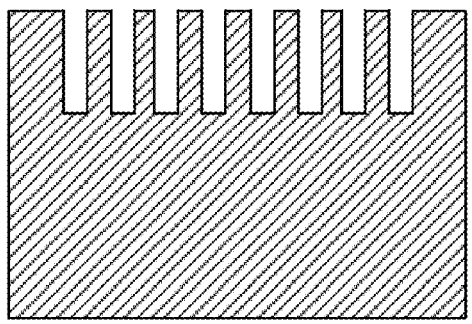
Fig. 3A Reactive Ion Etch
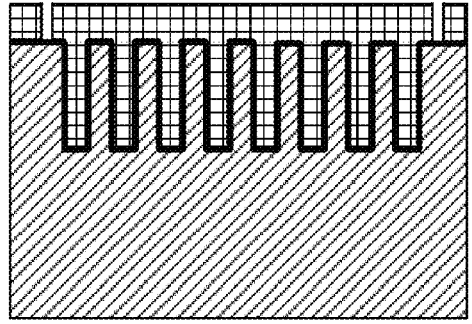
Fig. 3D Polysilicon Smoothing and Patterning
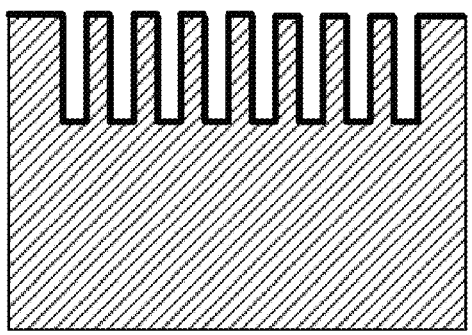
Fig. 3B Sacrificial Oxide Growth
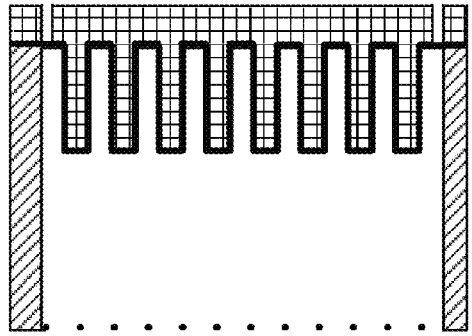
Fig. 3E Deep Reactive Ion Etch
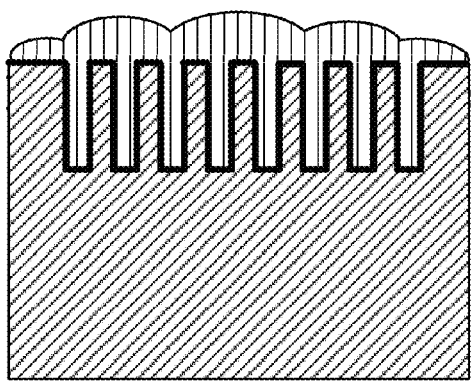
Fig. 3C Polysilicon Deposition
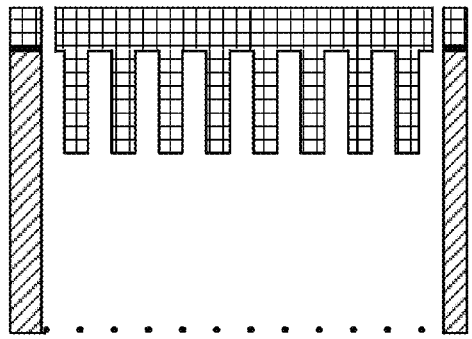
Fig. 3F Buffered Hydrofluoric Acid Release
Prior Art

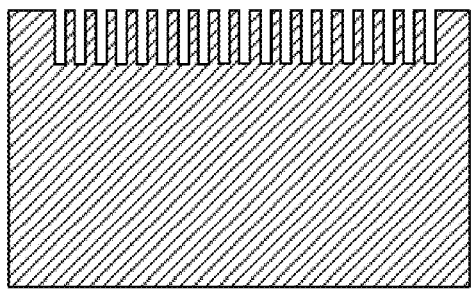
Fig. 6A Trench Etching
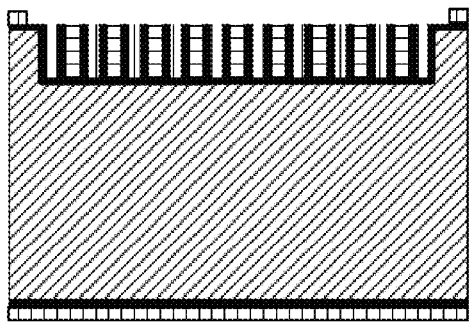
Fig. 6D Polysilicon Patterning
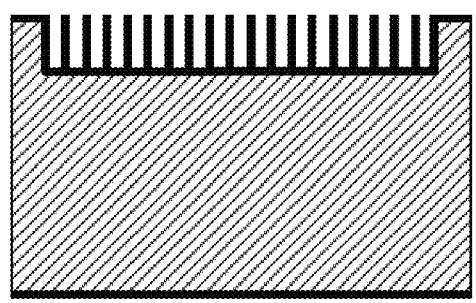
Fig. 6B Trench Oxidation
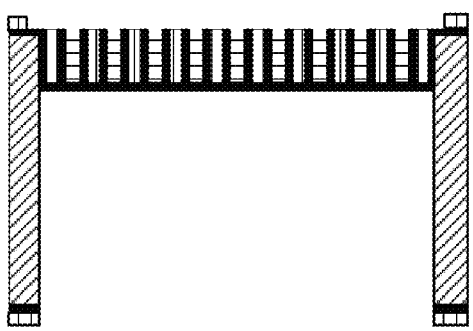
Fig. 6E Backside Etching
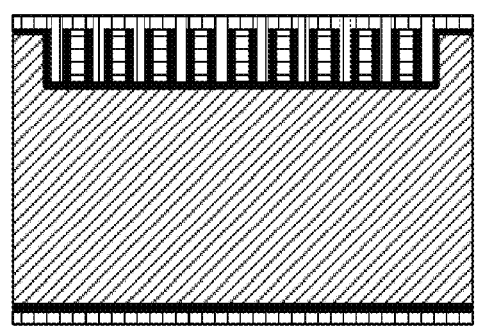
Fig. 6C Polysilicon Deposition
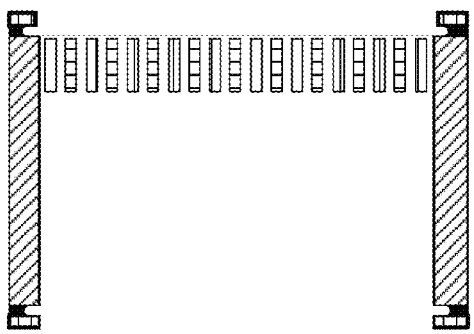
Fig. 6F Buffered Hydrofluoric Acid Release

HINGED MEMS DIAPHRAGM AND METHOD OF MANUFACTURE THEROF

CROSS REFERENCE TO RELATED APPLICATION

The present application is a non-provisional of, and claims benefit of priority from, U.S. Provisional Patent Application Ser. No. 61/708,282, filed Oct. 1, 2012, the entirety of which is expressly incorporated herein by reference.

STATEMENT OF FEDERAL SUPPORT

This invention was made with government support under awards R01 DC009859 and R01 DC009429 awarded by the National Institutes of Health. The government has certain rights in this invention.

FIELD OF THE INVENTION

The present invention relates to the field of micro-electromechanical system (MEMS) devices.

BACKGROUND OF THE INVENTION

Over the past twenty years researchers have created a nearly uncountable number of MEMS sensors and actuated structures using the tools of microfabrication. The scientific and engineering literature contains many examples of high-performance devices. There are, however, various barriers to manufacturing successful designs. While the fabrication methods MEMS designers have inherited from the microelectronics industry permit the construction of remarkably detailed and complex moving structures, fabrication-induced stresses and resulting fractures often result in a very poor yield.

One type of device which can be produced using micro-electro-mechanical systems (MEMS) technology is a microphone. Microphones can be omnidirectional, meaning that the microphone is responsive to the dynamically changing pressure incident on the diaphragm from all directions, or directional, meaning that the microphone is selectively sensitive to sound waves of particular propagation axes.

The advantages of MEMS microphones over electret condenser microphones (ECMs) are their size, performance, sound quality and suitability for mass production. The advantages of a microphone according to this design are its small size, low internal noise, low power consumption and high directionality. All of these features have been demonstrated during evaluation of a prototype and confirm its superior performance over existing commercially available MEMS directional microphones [7].

A particular type of directional microphone provides a "counterbalanced" diaphragm in which two adjacent portions, separated by a central pivot axis, are exposed to sound. The pivoting diaphragm is selectively responsive to acoustic waves depending on the inclination of the acoustic wave with respect to the plane of the diaphragm and pivot axis. This type of directional microphone is inspired by the acoustic sensory organ of *Ormia ochracea* [42].

The pivoting diaphragm itself requires a rotating support, which concentrates stress at the pivoting support. The basic design of such a directional microphone is shown in FIG. 1. These MEMS sensors are used, for example, to construct biomimetic directional microphones for hearing aid applications [1-13].

The fabrication of parallel plate electrodes is a common way to achieve capacitive sensing for microphones and other planar displacement sensors, and may be accomplished by depositing a sacrificial oxide film (typically having a thickness in the range of 5 to 10 microns) and then depositing a conductive material, such as silicon or metal, on top of the oxide. The space between the conducting electrode and the moving diaphragm may then be opened through a release etch, creating a diaphragm membrane which floats over a backplate, supported by a pair of opposed hinges. A disadvantage of employing parallel plate sensing is that the air between the diaphragm and the fixed electrode is squeezed as the diaphragm moves and must flow in the plane of the diaphragm. The viscous force due to the flow of air depends on the third power of the distance between the diaphragm and the stationary electrode, and can be a dominant source of damping in the system [19-26]. It is, of course, desirable to have this gap be as small as feasible to increase the amount of capacitance and the overall sensitivity of the device. While holes in the electrode can be designed to reduce the damping, it can be very difficult to design a system that has both high sensitivity and low damping, which is desired in a device that must move quickly.

An additional substantial difficulty with the use of parallel plate electrodes is that the bias voltage that is required between the electrode and the diaphragm results in an attractive force that compels the two surfaces to reduce the size of the gap. If the mechanical restoring force provided by the hinge is not sufficiently high, the use of too large of a bias voltage will cause the gap between the diaphragm and electrode to collapse completely, with the rear of the diaphragm contacting the backplate.

The use of interdigitated fingers at the periphery of the diaphragm can overcome many of the disadvantages of parallel plate electrodes, and can be fabricated in the same steps and mask as used to create the slits around the diaphragm.

While the use of interdigitated fingers solves many difficult problems inherent in parallel plate MEMS devices, there are practical difficulties that have greatly impeded their use. The main difficulties are that the capacitance that can be achieved is lower than desired, due to the small surface area of the interdigitated fingers and therefore small change in charge to the movement of the fingers, and that fabrication-induced stresses can result in cracks in the polysilicon film resulting in poor fabrication yield. As a result of these difficulties, nearly all of the 2 billion microphones produced each year employ parallel plate electrodes to achieve capacitive sensing.

Another example of a pivoting planar microstructure MEMS device technology is a so-called micromirror, which is an actuator driven device [14-18]. It is important that these devices be able to move as quickly as possible (thus implying maintaining a low inertia), and in many designs, they are designed to rotate about a hinge axis in a similar manner to the concept shown in FIG. 1. Reducing the inertia along with the stiffness of the supporting hinge also reduces the voltage (and power) needed for capacitive actuation. These systems are thus subject to the same stress concentration at the pivot as the concept of FIG. 1.

In an interdigitated electrode finger structure, a series of N fingers having length/extend in the plane of the diaphragm into a corresponding set of fingers held in fixed position, overlapping by a distance h and separated by a gap d. The diaphragm is free to move normal to its plane in the x direction, and thus the respective sets of fingers have a displacement related to the amount of movement. It is noted that the capacitance of the structures is generally the sum of the respective capacitances of the fingers, and therefore if there is variation, the individual values may be calculated and summed. The total capacitance C of a microphone structure using the interdigitation technique may therefore be roughly estimated by:

$$C = \frac{\varepsilon(h-x)}{d} l2N$$

If a bias voltage Vb is then applied between diaphragm and back plate, for example to permit sensing of the displacement, the resulting electrostatic force f (for small x, neglecting fringing effects) will be:

$$f = \frac{d}{dx}\left(\frac{1}{2}\frac{\varepsilon(h-x)}{d} l2NV_b^2\right) = -\frac{\varepsilon}{d} lNV_b^2$$

The bias voltage Vb does not reduce the stability of the diaphragm's motion in the x direction; a high bias voltage Vb may be used without a need to increase diaphragm stiffness, resulting in increased microphone sensitivity (for equal capacitance) without the diaphragm collapse problems. The applied static voltage results in an attractive force that acts to bring the moving sensing electrode toward the fixed electrode. In the case of the present comb-sense microphone, this attractive force acts to bring the microphone diaphragm toward its neutral position (i.e., x=0), in line with the fixed fingers. As a result, the bias voltage tends to stabilize the diaphragm rather than lead to instability. As long as the fingers are designed so that they themselves will resist collapsing toward each other, the diaphragm's compliance does not need to be adjusted to avoid collapse against the fixed electrodes. For example, the interdigital fingers may be provided on opposing sides of the diaphragm structure, so that the forces tending to displace it with respect to the finger gap balance each other. This means that the diaphragm may be designed to be highly compliant and thus very responsive to sound.

The following U.S. patents are expressly incorporated herein in their entirety: U.S. Pat. Nos. 7,041,225; 7,318,349; 7,520,173; 7,724,417; 7,808,640; 7,825,484; 7,903,835; 8,129,803; 8,165,323; 7,542,580; 6,963,653; 7,471,798; 7,545,945; 7,826,629; 7,992,283; 8,073,167; 7,146,016; 7,146,014; and 6,788,796.

SUMMARY AND OBJECTS OF THE INVENTION

The present technology provides an improved method of incorporating capacitive actuation and/or sensing in a microstructure that is intended to undergo rotational out of plane motions, as is used in sensors for sound or motion as well as micromirrors and oscillators. Likewise, coupled systems may include both actuation and sensing.

A particular problem with creating a light-weight structure that is intended to rotate rapidly out of plane, is that the point or axis about which it rotates will comprise a stress concentration, which can adversely affect fabrication yield. This problem is addressed, by designing and creating a method of fabricating interdigitated comb-fin structures that serve the dual purpose of protecting the highly compliant rotational axis from fabrication-induced stresses while providing a highly effective mechanism for linear capacitive actuation and sensing.

A particular feature of various embodiments is an exploitation of the potential for high depth aspect ratios in micromachined structures. The technology enables the construction of lighter-weight (and hence rapidly movable) rotational structures than are possible with existing micromachining technology that meets the same performance criteria. The fabrication of these devices typically requires the deposition of a structural film (such as polycrystalline silicon) onto a sacrificial film (such as thermal silicon oxide). The present technology generally eliminates the structural stress (and associated fracture failures) of the structural film that arise both prior to and during the removal of the sacrificial layer. This problem has hampered the creation and manufacture of a number of important microdevices.

The present technology therefore provides, according to one embodiment, a micromechanical structure, comprising a substrate having an aperture, a sacrificial oxide layer peripheral to the aperture; and a polysilicon layer overlying the aperture patterned to have (a) a planar portion; (b) a supporting portion connecting the planar portion to a region of the polysilicon layer peripheral to the aperture; (c) a pattern of polysilicon stiffeners extending beneath the planar portion overlying the aperture; and (d) a pattern of polysilicon ribs surrounding the supporting portion, attached near a periphery of the planar portion, the polysilicon ribs extending from the planar portion to a depth beneath the polysilicon stiffeners, and extending laterally beyond an edge of the planar portion. The polysilicon ribs may form a set of fingers which interdigitate with a corresponding set of polysilicon fingers extending from the polysilicon layer peripheral to the aperture, such that when the planar portion moves, e.g., by a flexion or torsion of the supporting portion due to acoustic waves, a relative movement causes one set of fingers to move out of plane with respect to the other set of fingers, and thus define e.g., an interdigitated sensor.

An exemplary application of this technology is the fabrication of a directional microphone having a diaphragm which rocks about a pivot axis, which may be used, e.g., for hearing aid applications. The technology provides improvements in cost, fabrication yield, and reliability of this microphone. Other devices that employ torsional structures or rotating planar microstructures may likewise be designed and fabricated using this technology.

The technology provides an improved method of fabricating microstructures that are intended to undergo rotational out-of-plane motions, as are used in sensors for sound or motion as well as micro-mirrors, microoptoelectronic systems, microfluidic devices, valves, micro-motors, and oscillators, for example. A major problem with creating a light-weight structure that is intended to rotate rapidly out of plane is that the point or axis about which it rotates will concentrate stress, which can adversely affect fabrication yield and lead to eventual device failure.

The present technology provides a method of fabricating interdigitated comb-fin structures that serve the dual purpose of protecting the highly compliant rotational axis from fabrication-induced stresses, while providing a highly effective mechanism for linear capacitive actuation and/or sensing, in particular by providing high depth aspect ratio structures.

The present technology provides a practical method of implementing interdigitated electrodes in devices that deflect out-of-plane. This increases the capacitance, and thus improves the signal. Likewise, the processes and resulting structures reduce stress induced cracks proximate to the hinges.

In any device that utilizes capacitance for either actuation or sensing, the overall system performance is a strong function of the nominal device capacitance and the rate at which the capacitance changes with the primary structure's deflection. In sensors that must detect extremely small motions (such as microphones), one typically desires a device capacitance that is on the order of 1 pF. This is because typical parasitic capacitances (due to bond pads, wiring, and the buffer amplifier input capacitance) often are also on the order of 1 pF. Because of a number of practical design constraints, this amount of source capacitance has been extremely difficult to achieve in practice. In addition, the variation in capacitance with the deflection of the diaphragm can prove to be nonlinear, which adversely affects the performance. While sensors with small source capacitance can be accommodated with careful design of the interface electronics, the performance and overall system cost will improve if the source capacitance is increased.

The capacitance in the gap between the interdigitated fingers is roughly inversely proportional to the distance across the gap and approximately proportional to the depth of the gap. Unfortunately, there are practical limits on how small the distance across the gap can be formed using typical optical lithography. Creating a gap that is smaller than approximately 1 micron can be very difficult using readily available photolithographic tools. It is also difficult to increase the depth of the gap since this typically will be equal to the thickness of the material (polysilicon) used to form the diaphragm skin. Since it is desirable to have the skin be as thin (and as lightweight) as possible, the thickness is typically on the order of one to two microns. The gap is thus roughly as deep as it is wide.

Because the gap between the interdigitated fingers is on the order of one micron deep, a typical initial deflection (due to static stresses occurring during fabrication) that is greater than one or two microns can result in a significant loss of capacitance, and hence, a reduction in sensitivity. The sensitivity of a fabricated structure can thus be very dependent on the initial static deflection.

The present technology provides a new fabrication process that makes it practical to create interdigitated electrodes having substantially greater capacitance than has previously been achievable in thin diaphragm structures. The signal from the resulting electrodes is also predicted to vary in a much more linear manner with the deflection of the planar diaphragm than is found in conventional interdigitated fingers.

It is therefore an object of this technology to provide a micromechanical structure, comprising: a substrate having a through hole; a residual portion of a sacrificial oxide layer peripheral to the through hole formed on the substrate; and a polysilicon layer overlying the through hole, patterned to have: a planar portion; at least one supporting portion connecting the planar portion to a portion of the polysilicon layer on the residual portion of the sacrificial oxide layer peripheral to the through hole; a first pattern of polysilicon stiffeners formed extending beneath the planar portion overlying the through hole, configured to stiffen the planar portion; and a second pattern of polysilicon ribs selectively disposed surrounding the at least one supporting portion, attached near a periphery of the planar portion, wherein the polysilicon ribs extend from the planar portion to a depth beyond a depth of the polysilicon stiffeners, and extend laterally beyond an edge of the planar portion.

At least a portion of the second pattern of polysilicon ribs may be configured as a set of fingers which interdigitate with a corresponding set of fingers, formed of polysilicon, extending from a portion of the polysilicon layer on the residual portion of the sacrificial oxide layer peripheral to the hole, wherein the planar portion is configured to move, by a flexion or torsion of the at least one supporting portion, to thereby cause a relative movement of the set of fingers with respect to the corresponding set of fingers out of a plane of the planar portion. The set of fingers and the corresponding set of fingers may be conductive and electrically isolated, and are configured to act as a capacitive displacement sensor.

The planar portion may move in response to acoustic vibrations. The planar portion may be configured to rotate in response to acoustic vibrations.

The planar portion may be supported by a pair of opposed supporting portions, and be configured to rotate in response to acoustic vibrations about an axis defined by the pair of opposed supporting portions.

The planar portion may comprise a diaphragm of a directional microphone.

The polysilicon ribs may have a height at least 10 times a thickness of the planar portion.

The polysilicon stiffeners may intersect the polysilicon ribs.

Another object provides a method of forming a micromechanical structure, comprising: etching at least one trench into a substrate in a first etch; forming a sacrificial layer on the substrate and walls of the at least one trench; depositing a structural layer over the sacrificial layer, extending into the at least one trench; etching a boundary of a structure formed from the structural layer, wherein at least a portion of the structural layer overlying portions of the at least one trench is removed in a second etch; etching a void through the substrate from beneath the structure in a rear etch; and removing at least a portion of the sacrificial layer, to preserve a portion of the structural layer separated from the substrate by a fluid space, wherein at least a portion of the sacrificial layer on the walls of the at least one trench is removed subsequent to removal of a portion of the sacrificial layer on the substrate.

The portion of the structural layer separated from the substrate by a fluid space may be flexibly supported by a narrow portion of the structural layer, and the at least one trench may be formed proximate to the narrow portion, the sacrificial layer underlying the narrow portion being removed before the sacrificial layer on the walls of the at least one trench, such that the narrow portion remains held in position by the structural layer which extends into the at least one trench while the sacrificial layer underlying the structural layer in regions absent the at least one trench is removed before the sacrificial layer adjacent to the structural layer which extends into the at least one trench, the removing of the sacrificial layer proceeding until the structural layer which extends into the at least one trench is free to move into and out of the trench by a flexion of the narrow portion.

The substrate may comprise silicon, and the sacrificial layer may comprise silicon dioxide formed by oxidizing a surface of the silicon substrate. The sacrificial layer may be removed by dissolution of the silicon dioxide sacrificial layer in hydrofluoric acid.

The at least one trench may comprise at least two trenches, having different depths, wherein the deeper trench is formed proximate to the narrow portion, to thereby support the narrow portion while the sacrificial layer on the walls of the shallower trench is removed.

The at least one trench may be formed by reactive ion etching. The second etch may also comprise reactive ion etching. The rear etch may comprise a through-wafer, deep reactive ion etch.

The at least one trench may be provided as a pair of linear arrays of trenches to define a set of interdigitated fingers. The second etch may free a portion of the set of interdigitated fingers attached within the boundary to the structure to move with respect to a portion of the set of interdigitated fingers detached from the structure. The interdigitated fingers may be conductive, thus forming a capacitive displacement sensor. The interdigitated fingers may have a depth greater than about ten times a thickness of the structural layer. The interdigitated fingers may overly the void, and at least a portion of the set of interdigitated fingers may be free to move toward and away from the void.

The sacrificial layer may be formed by chemically converting the substrate to another composition, wherein the set of interdigitated fingers is defined by trenches formed sufficiently close, and conversion is conducted to completely convert a wall between adjacent trenches to the other composition.

The sacrificial layer may keep the structure from being fully released after the rear etch.

The structure may comprise a diaphragm of a microphone, which displaces in response to acoustic vibrations. The diaphragm may pivot about a pair of narrow portions. The diaphragm may further symmetrically pivot about the pair of narrow portions, to provide a directional acoustic response.

The at least one trench may comprise a first set of trenches which define a set of stiffeners configured to stiffen the structure, and a second set of trenches, deeper than the first set of trenches, configured to define supports for the structure which are released from the substrate by removal of the sacrificial layer after the stiffeners are released from the substrate. Respective ones of the first set of trenches may intersect ones of the second set of trenches.

The method may further comprise defining third and fourth sets of trenches, configured to together form a set of interdigitated fingers, the third set of trenches defining a first set of fingers attached to the substrate, and the fourth set of trenches defining a second set of fingers attached to the structure and interleaved with the first set of fingers, and moveable with the structure with respect to the substrate. The second set of trenches may be deeper than the first set of trenches.

The sacrificial layer may serve as an etch stop which limits an extent of the rear etch.

A surface of the structure may remain fixed to the substrate through the sacrificial layer until the removing is conducted. The structural layer may comprise polysilicon, which covers the substrate and fills the at least one trench.

A plurality of structures may be formed on the substrate, the method further comprising separating a plurality of dice each containing at least one structure prior to said removing.

The method may further comprise rinsing the substrate after said removing, and then drying the substrate in a critical point drier to avoid stiction.

It is understood that the deep trenches support the fragile portion during processing, and are freed as a late step in fabrication, avoid stress on the fragile portion, and may be used in various MEMS systems. The fragile portion may be used in flexion or torsion, and may be a supporting element, actuator, sensor, or the like. In general, it is desirable to free the protective structure from the substrate by removing the sacrificial layer which holds it in place; however, some devices do not require complete removal, and therefore a partial removal may be used, retaining a portion of the sacrificial oxide deep in the trench, for example, in regions of the substrate not aligned with the rear through hole.

BRIEF DESCRIPTION OF THE FIGURES

The invention will now be explained by way of example, in which:

FIGS. 3A-3F show a fabrication process according to the prior art for microphone diaphragm shown in FIGS. 1 and 2, with interdigitated comb fingers at the perimeter of the diaphragm:

FIG. 3A, Deep reactive ion etching (RIE);
FIG. 3B, Thermal oxide growth;
FIG. 3C, Polysilicon deposition;
FIG. 3D, Polysilicon smoothing and RIE to define diaphragm and comb fingers;
FIG. 3E, Backside RIE; and
FIG. 3F, Buffered hydrofluoric acid etching to remove the thermal oxide.

FIGS. 6A-6F show a fabrication process for interdigitated comb fins according to the present invention, in which stiffeners can be incorporated through the use of a separate trench etch as in the initial step:

FIG. 6A, Trench etching;
FIG. 6B, Trench oxidation;
FIG. 6C, Polysilicon deposition;
FIG. 6D, Polysilicon patterning;
FIG. 6E, Backside etching; and
FIG. 6F, Buffered hydrofluoric acid release.

FIG. 8B is an intermediate stage.

DESCRIPTION OF THE INVENTION

Figure 3G:
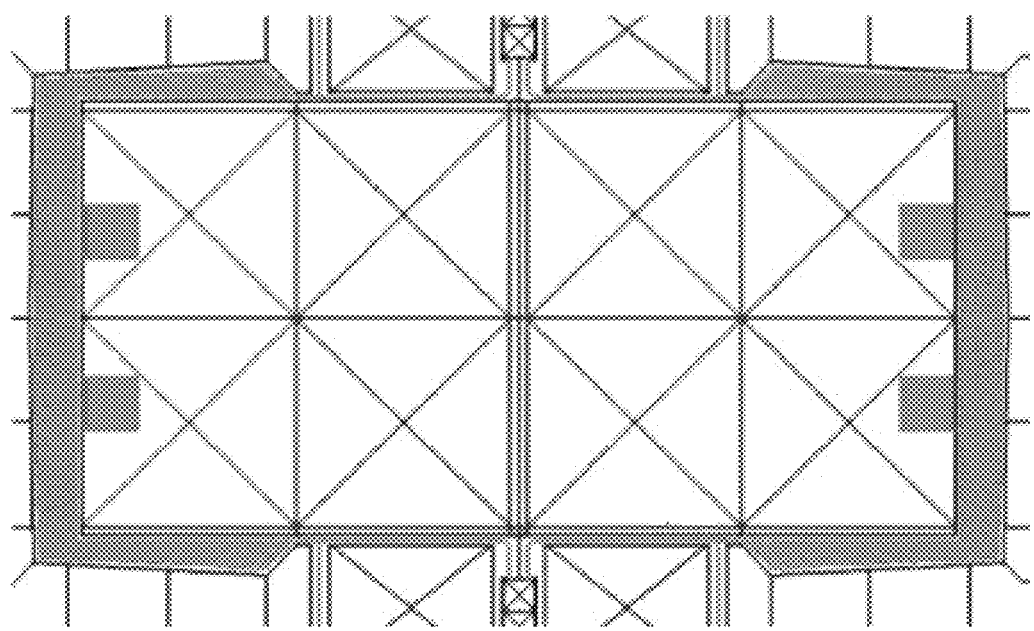
FIG. 3G shows an L-Edit image of the prior art silicon differential microphone diaphragm shown in FIGS. 1 and 2 with comb fingers, the light green lines are the slits that define the diaphragm and the comb fingers, the red lines are the stiffeners that reinforce the diaphragm.

According to one embodiment of the technology, a 1 mm×2 mm microphone diaphragm is made of polysilicon and has stiffeners and carefully designed hinge supports to ensure that it responds like a rigid body on flexible hinges. Larger microphone diaphragms, e.g., 1 mm×3 mm are also possible. The diaphragm is designed to respond to pressure gradients, e.g., due to acoustic waves in air, giving it a first-order directional response to incident sound. Both the diaphragm and stiffening ribs are made of LPCVD (low pressure chemical vapor deposition) polysilicon. The diaphragm is ~2 μm thick and the stiffening ribs are 4 μm wide and 40 μm tall. This structure provides a highly compliant differential microphone that responds to the differences in pressure on the two sides of the diaphragm that are separated by the hinges at the center [4, 20-22]. Interdigitated fingers, which consist of 100

μm long, 1.5 μm wide fingers with 6 μm periodicity, are incorporated at the perimeter of the two ends of the diaphragm, the locations with maximum deflection. FIG. 3G shows the L-Edit image for the microphone diaphragm with interdigitated comb sense fingers.

Figure 1A:
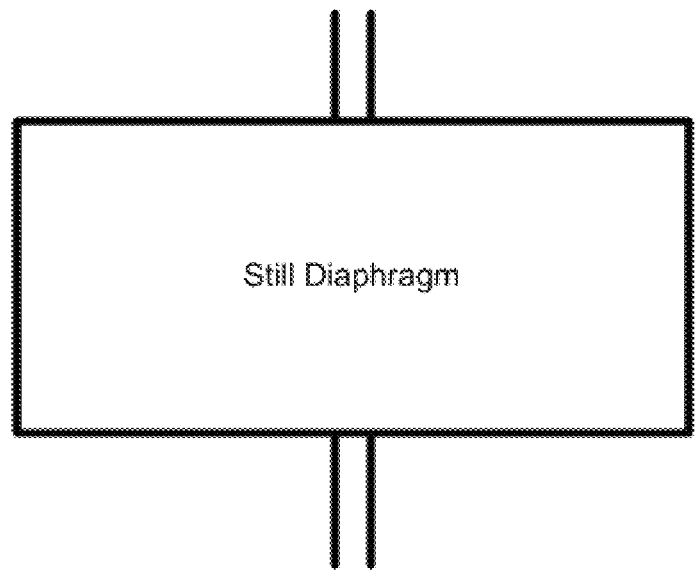
FIGS. 1A and 1B show a top and side view, respectively, of a prior art planar microstructure that is supported on flexible hinges; the structure is fabricated on a silicon chip that supports the hinges, and the diaphragm is separated from the surrounding substrate by etching a slit around the perimeter while leaving the connection at the hinges intact.
Figure 1B:
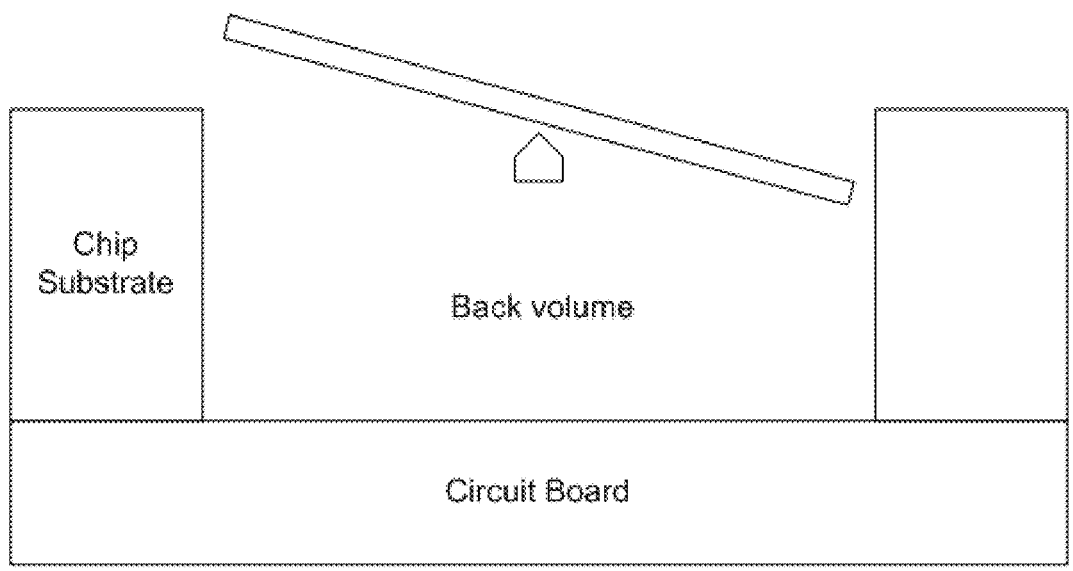

FIG. 1 shows a planar microstructure that is supported on flexible hinges. The structure is fabricated on a silicon chip that supports the hinges. The diaphragm is separated from the surrounding substrate by etching a slit around the perimeter while leaving the connection at the hinges intact. The structure shown in FIG. 1 consists of a diaphragm that is supported on a pair of hinges and is separated from the rest of the silicon chip by a slit. The diaphragm is intended to rotate like a rigid body without bending, so that its motion is dominated by rotation about its central axis. In applications where the rotation of the structure is intended to occur rapidly, it is essential that the mass moment of inertia about the pivot axis be as small as possible. To achieve the stiff diaphragm, stiffeners may be provided on a thin membrane, to maintain its rigid body motion.

Figure 2:
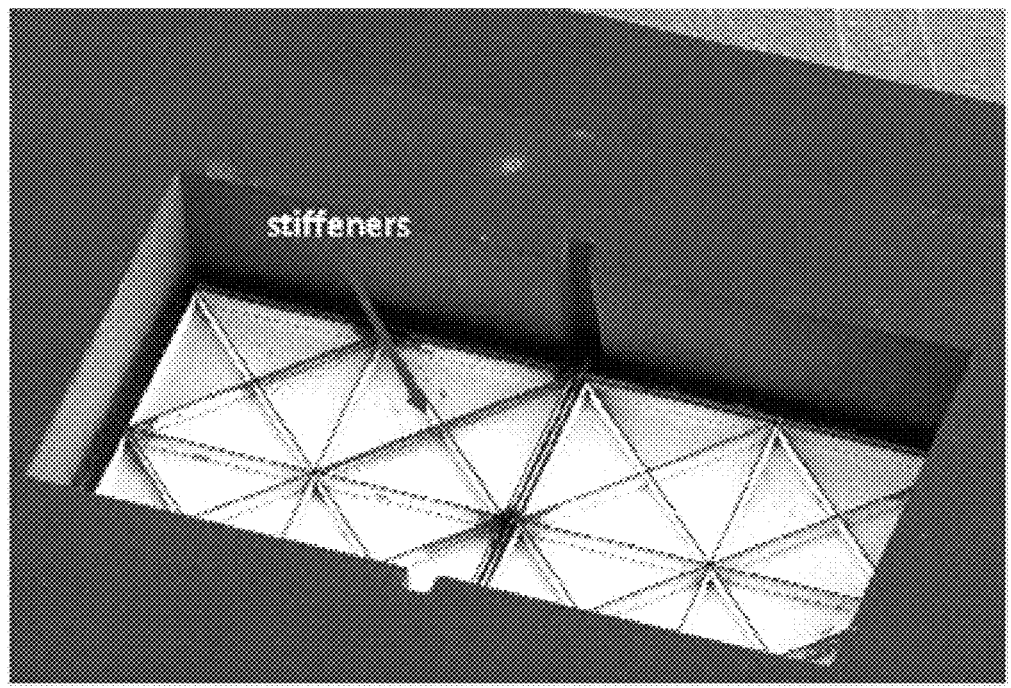
FIG. 2 shows the stiffened diaphragm of FIG. 1, as seen through the hole in the backside of the chip.

FIG. 2 shows a stiffened diaphragm, as seen from the backside, through the backside hole below the diaphragm. This structure's motion is dominated by the rocking motion about the central hinge axis as in the concept of FIG. 1. FIG. 2 does not show the slit that surrounds the diaphragm at all locations other than at the pivots.

The stiffeners shown in FIG. 2 are formed using the same polysilicon material that is used to make the planar portion (the skin) of the diaphragm. The diaphragm shown in FIG. 2 is 2 mm long and 1 mm wide. The stiffeners are 30 microns tall and 2 microns wide. The skin of the diaphragm is approximately 1.5 microns thick. The substrate chip is 500 microns thick, which is also the depth of the rectangular hole shown in FIG. 2. The planar microstructure is created by processing silicon wafers using the tools commonly employed in silicon microfabrication.

FIG. 2 shows the fabrication process flow for the microphone diaphragm. The process begins in step 1 with a deep reactive ion etch of a bare silicon wafer to create trenches that are approximately 3 microns wide and 30 microns deep that act as the mold for the polysilicon stiffeners.

This is followed, in step 2, by a wet oxidation at 1100 degrees Celsius to grow a one-micron thick thermal oxide layer on the wafer surface and in the trenches. This oxide is used as an etch stop for a subsequent backside cavity etch.

The phosphorus-doped polysilicon is then deposited onto the thermal oxide at 580 degrees Celsius through low-pressure chemical vapor deposition (LPCVD) and subsequently annealed to form polycrystalline silicon at 1100 degrees Celsius in argon gas for 60 minutes in order to reduce intrinsic stress in the film in step 3.

The next step 4 planarizes the annealed polysilicon to form a flat diaphragm surface having stiffeners followed by reactive ion etching to define the interdigitated comb sense fingers and slits that separate the diaphragm from the substrate around the perimeter of the diaphragm so that it will eventually be supported only on the flexible hinges.

A through-wafer, deep reactive ion etch of the back cavity is then performed in step 5, to free the back side of the diaphragm. This etch stops on the thermal oxide film grown in step 2.

Finally, the diaphragm is released in step 6, using buffered hydrofluoric acid to remove the thermal oxide.

Figure 5:
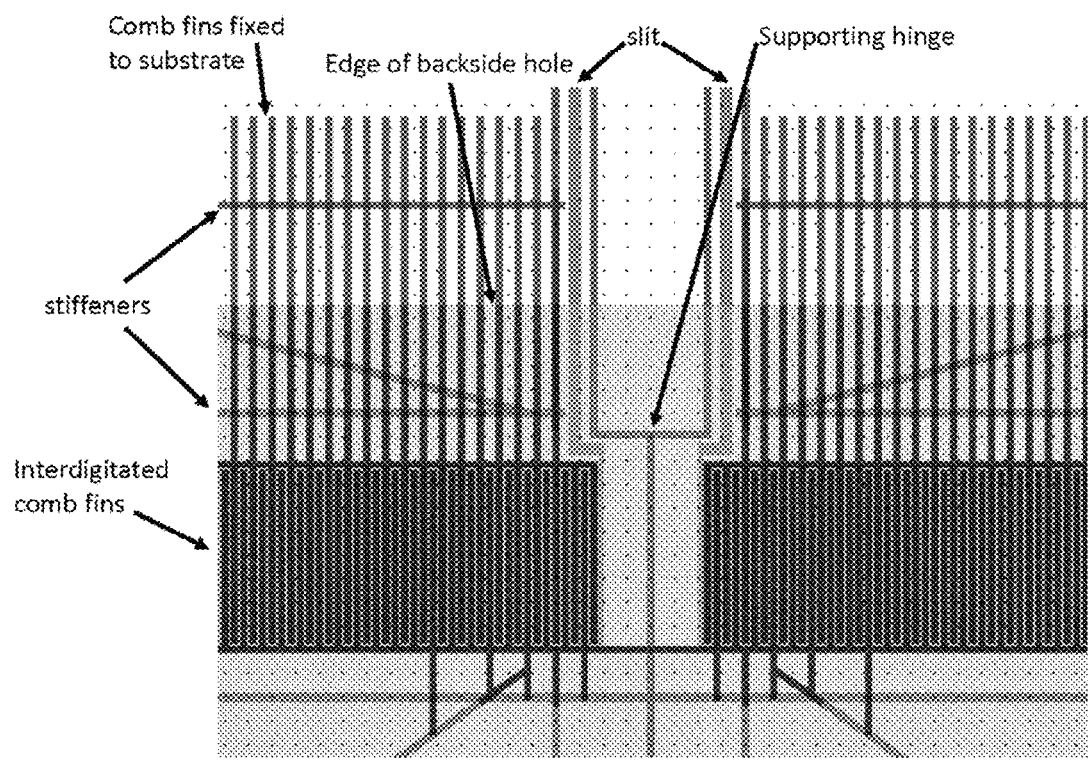
FIG. 5 shows a mask design (showing only the region near the supporting hinge) of comb fins to protect the supporting hinge according to the present invention.
Figure 7:
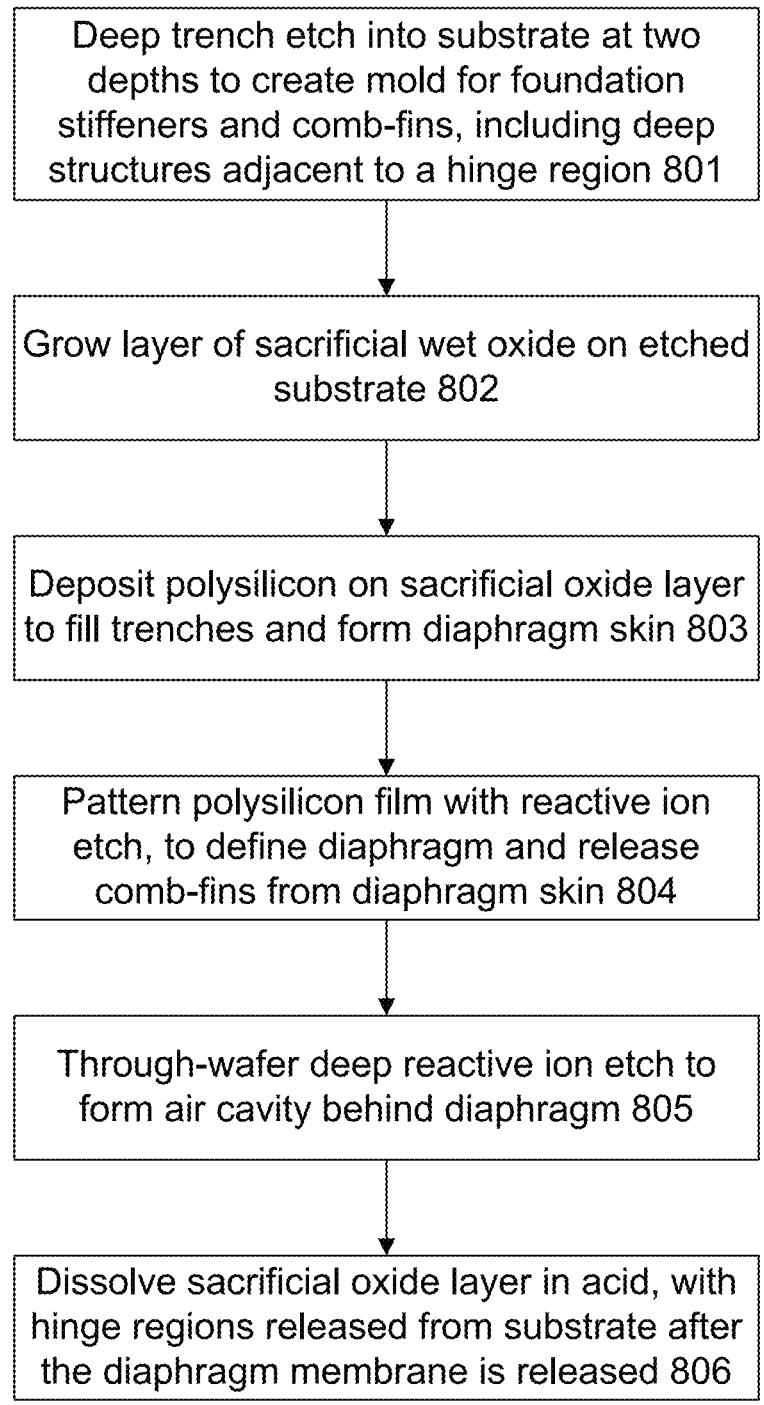
FIG. 7 shows a flowchart of the fabrication process according to FIG. 6.

The process of FIGS. 3A-3F schematically show a practical method to create light-weight, yet stiff planar structures that are supported on flexible hinges. To create a device that can be actuated (such as a mirror) or to create a sensor (such as a motion detector or microphone), one may incorporate capacitive electrodes into the fabrication process of FIGS. 3A-3F. This could be accomplished either by constructing parallel plate-type capacitive electrodes at either end of the diaphragm or by modifying the slit etch to construct interdigitated fingers at the ends as shown in FIG. 5. The biologically-inspired microphone with interdigitated comb sense fingers, see e.g., U.S. Pat. No. 7,545,945 and U.S. Pat. No. 8,073,167, expressly incorporated herein by reference, is fabricated on a silicon substrate using a combination of surface and bulk micromachining techniques. This fabrication technique uses deep-trench etching and sidewall deposition to create very lightweight, very stiff membranes with stiffening ribs at optimal locations.

Figure 4:
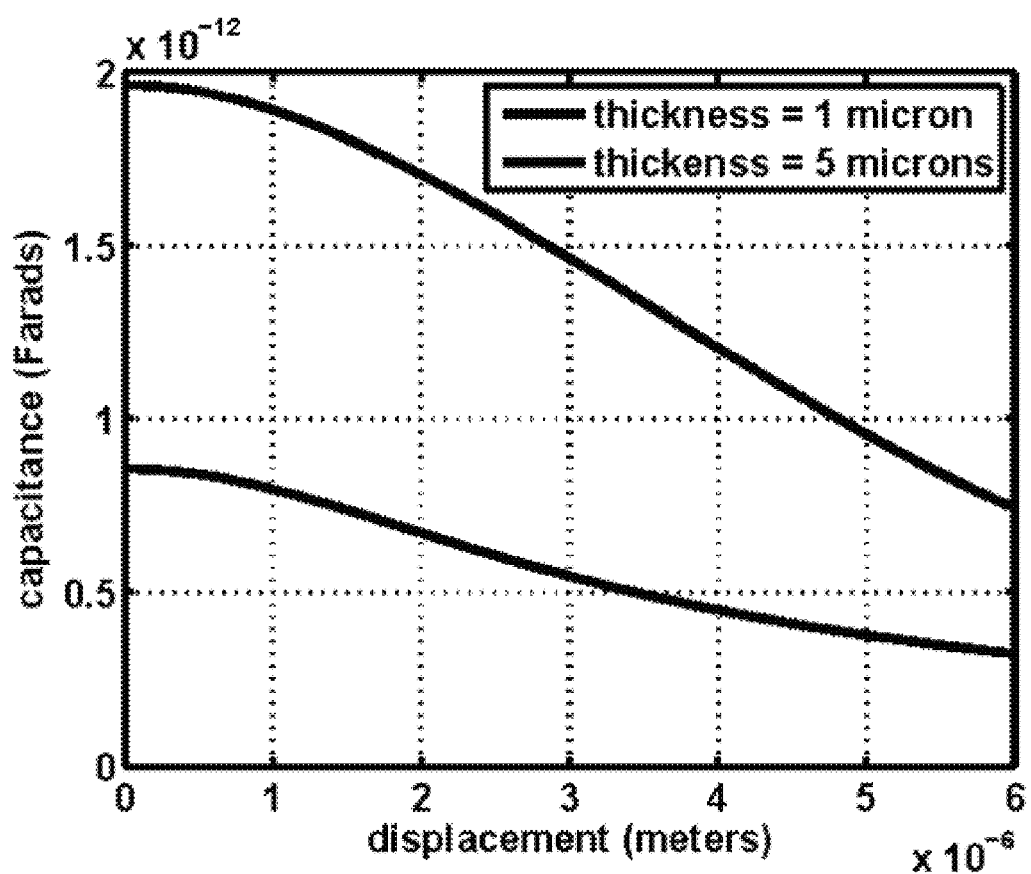
FIG. 4 shows a predicted capacitance of a diaphragm according to the present invention, as a function of the out of plane displacement of the planar diaphragm. The proposed research will greatly facilitate the creation of electrodes having thickness on the order of five to ten microns, leading to substantial improvements in performance as shown.

An analytical model predicts the capacitance of these interdigitated electrodes as a function of the out of plane displacement of the planar diaphragm, as shown in FIG. 4. This technology enables the creation of electrodes having thickness on the order of five to ten microns, leading to substantial improvements in performance as shown. The fabrication process enables fabrication of interdigitated fingers having substantially larger thickness (in the direction normal to the plane of the diaphragm) than has been practical previously. Rather than constructing fingers having a thickness that is equal to that of the diaphragm skin (on the order of one micron), this process allows us to construct interdigitated fins having a thickness on the order of five to ten microns. This results in a dramatic increase in capacitance as shown in FIG. 4. In addition, the predicted capacitance is seen to vary much more linearly with the diaphragm deflection with this increased electrode thickness.

The results shown in FIG. 4 are for a device having dimensions that are appropriate for a MEMS microphone, and indicate that the nominal sensor capacitance is increased significantly by the use of five micron thick electrodes rather than one micron electrodes. The source capacitance is greater than the target minimum value of 1 pF, and is seen to vary linearly with the diaphragm deflection for a wide range of displacement.

While the fabrication process exemplified in FIGS. 3A-3F easily permits the incorporation of interdigitated fingers, the resulting diaphragms can be subject to stress-induced fracture during the final release etch. The diaphragm material is subjected to substantial stresses after completion of the back side deep reactive ion etch (FIG. 3E) because the sacrificial thermal oxide typically has approximately 350 MPa of compressive stress relative to that of the bulk silicon wafer. This is in contrast to the polysilicon that comprises the diaphragm which has approximately 50 MPa of stress (either compressive or tensile, depending on the anneal process, etc.). This substantial compressive stress on such a thin diaphragm results in substantial deflection, typically in the negative direction (toward the back side hole). As the wet etch release commences, portions of the slit may be released while oxide remains over much of the diaphragm surface, resulting in even greater deflections of the diaphragm. This can result in excessive deformations and stresses at the hinge support, which can produce cracks in this critical element of the system.

The present technology creates interdigitated electrodes having significantly increased thickness (i.e., depth into the plane of the structure) which causes the electrodes to also have substantially increased bending stiffness, that resist flexure of the diaphragm during the fabrication process. The interdigitated electrodes are separated by sacrificial oxide having a thickness of approximately one micron. During the release process, this oxide is likely to remain longer than that on the planar portions of the diaphragm. This is because the oxide that separates the electrodes is contained within a space that is approximately five microns deep, one micron wide and having a length equal to that of the electrodes (typically 50 to 100 microns). The wet etch process will require considerably longer to remove this buried material than that which is covering the plane surface of the diaphragm. The electrodes will thus resist flexure (and the associated damaging stresses and strains) that occur around the perimeter of the diaphragm. If the electrodes are also utilized in the vicinity of the delicate hinge support, they would provide considerable protection from the oxide compressive stress.

The thickened interdigitated electrodes may be configured to provide a substantial increase in resistance to flexure in the vicinity of the diaphragm's hinge support. It is believed that this increased stiffness will provide sufficient protection to prevent cracks in the hinge and diaphragm during the wet release.

The technology provides a method for creating interdigitated fins that provide the dual benefits of substantially increased capacitance over what can be achieved with interdigitated fingers which are limited to the thickness of the diaphragm (itself limited in thickness due to mass issues), and a reduction in structural stress during the critical steps in the fabrication process. These benefits may be achieved together or independently, and thus the thick interdigitated fins do not require protection of a hinge structure, and a protected hinge structure does not also require thick fins. The fins essentially combine the structural functions of the stiffeners and the capacitive functions of the fingers, described above. This process enables the practical construction of interdigitated electrodes having a depth that can be substantially greater than the thickness of the diaphragm skin. For example, a fin depth can be 5 to 10 microns, rather than the approximately one micron depth of the skin. Since the bending stiffness of the fins is proportional to the cube of the depth, this structure provides a dramatic increase in resistance to flexure, which serves to protect the supporting hinge during the release process. In addition, the increased depth of the interdigitated electrodes provides an increase in capacitance as shown in FIG. 4.

FIG. 5 shows a plan view of a mask design the interdigitated fins near the supporting hinge of the diaphragm, which serve to protect the supporting hinge. The fins are fixed to the substrate and the planar sheet on each side, and form an interdigitated comb fin structure where they approach one another, the slit etch is immediately lateral on each side of the supporting hinge, and define the lateral edges of a torsional bridge between the substrate and planar sheet, and the stiffeners extend perpendicular or diagonal to the comb fins, as well as being provided parallel to the comb fins adjacent to the slit etch. FIG. 5 shows only the region near the supporting hinge. The supporting hinge in this case consists of a stiffener that spans the entire width of the approximately rectangular structure and terminates in the bulk silicon comprising the substrate. FIG. 5 shows interdigitated fins in the vicinity of the hinge but they may also be incorporated around the entire diaphragm perimeter. The fins that are adjacent to the hinge are primarily employed to protect the hinge during fabrication; the limited motion of the diaphragm near the hinge causes these nearby electrodes to have minimal use for sensing or actuation.

The fabrication process to create the interdigitated comb fins is shown in FIGS. 6A-6F and FIG. 7. Note that stiffeners can be incorporated through the use of a separate trench etch, as in step 801. FIGS. 6A-6F show cross section views of the wafer. A plan view is provided in FIG. 5, which shows that the trenches used to create the fins have separate terminations for fins that move with the diaphragm and for those that are fixed to the surrounding substrate.

The fabrication starts in step 801, with a deep trench etch (FIG. 6A) into the silicon wafer to create a mold for the diaphragm and foundation stiffeners having a first depth from a first etch, and for the two sets of comb-fins having a shallower second depth from a second etch. See FIG. 8C The ends of the fin trenches intersect with the stiffener-trenches. According to alternate embodiments, the first etch may be the same or deeper than the second etch. In like manner, various structures may be formed at different, independently controlled depths to form a complex structure.

A layer of sacrificial wet oxide (FIG. 6B) is grown in step 802 to form an etch stop for the backside cavity etch, and to form the gap between the fixed comb-fins and moving comb-fins. The oxide layer should be thick enough such that the bulk silicon between the trenches for the two sets of comb-fins is completely oxidized. The oxide layer also keeps the fragile diaphragm from being fully released following the backside cavity etches. The oxide will hold the diaphragm firmly in place until it is etched away from between the fins during the final step, as shown in FIG. 8B, and thus serves to avoid stress and curling.

Figure 8A:
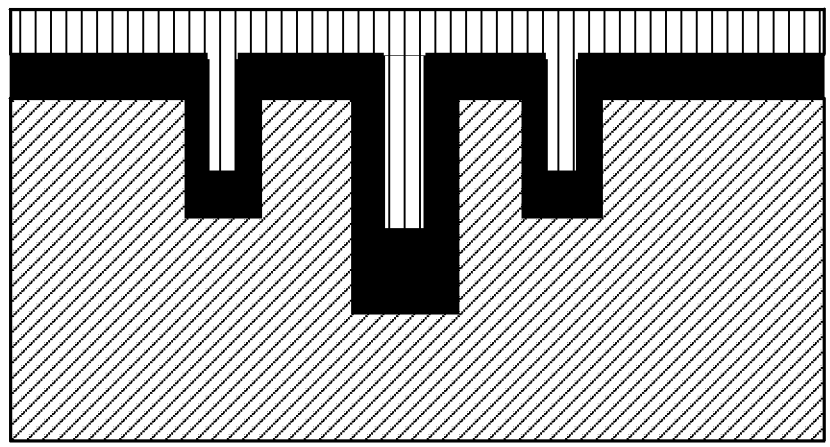
FIGS. 8A-8C show cross section views of micromechanical device during fabrication in which FIG. 8A corresponds to the stage represented in FIG. 6E, FIG. 8C corresponds to the stage represented in FIG. 6F.
Figure 8B:
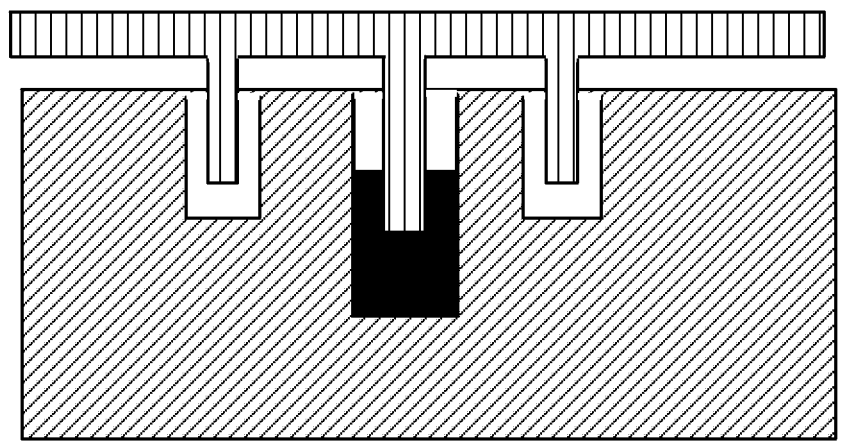

The polysilicon is deposited in step 803 (FIG. 6C), such that the deposited polysilicon fills the trenches that will become the supporting stiffeners and the comb-fins, as shown in FIG. 8A. The polysilicon on the surface of the wafer will form the diaphragm 'skin'.

The polysilicon film is then patterned (FIG. 6D) in step 804, with a reactive ion etch, to separate the diaphragm from the foundation and remove the polysilicon layer above the two sets of comb-fins so that they can be displaced in and out of the plane of the diaphragm.

Step 805 consists of a through-wafer, deep reactive ion etch on the backside (FIG. 6E), to create a cavity that defines the air chamber behind the diaphragm. The wafer may be diced into chips, to provide separate microphones, or maintained as an integral substrate for a microphone array.

Figure 8C:
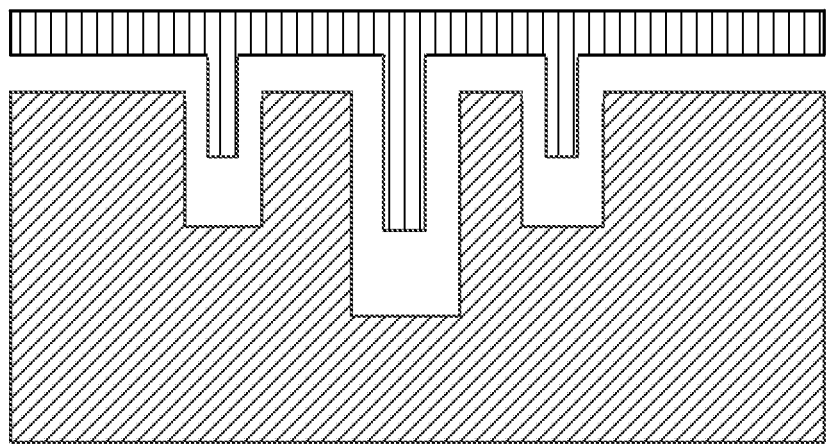

Step 806 provides the final release, achieved by dissolving the sacrificial oxide layer in buffered hydrofluoric acid (FIG. 6F, FIGS. 8B and 8C). The structures are rinsed, and placed in a critical point drier (to avoid stiction).

In this description, several preferred embodiments were discussed. It is understood that this broad invention is not limited to the embodiments discussed herein, but rather is composed of the various combinations, subcombinations and permutations thereof of the elements disclosed herein. The invention is limited only by the following claims.

REFERENCES (The entirety of the below references are each expressly incorporated by reference in their entirety)
1. K. Yoo, C. Gibbons, Q. Su, R. Miles, and N. Tien, "Fabrication of biomimetic 3-D structured diaphragms", Sensors and Actuators A-Physical 97-8, 448-456 (2002), Transducers 2001 Conference/Eurosensor XVth Conference, Munich, Germany, Jun. 10-14, 2001.
2. L. Tan, R. Miles, M. Weinstein, R. Miller, Q. Su, W. Cui, and J. Gao, "Response of a biologically inspired NMMS differential microphone diaphragm", in Unattended Ground Sensor Technologies and Applications IV, edited by Carapezza, E M, volume 4743 of Proceedings of the Society of Photo-Optical Instrumentation Engineers (SPIE), 91-98 (2002), Conference on Unattended Ground Sensor Technologies and Applications IV, Orlando, Fla., Apr. 2-5, 2002.
3. R. Miles and R. Hoy, "The development of a biologically-inspired directional microphone for hearing aids", Audiology and Neuro-Otology 11, 86-94 (2006).
4. W. Cui, B. Bicen, N. Hall, S. Jones, F. Degertekin, and R. Miles, "Optical sensing in a directional MEMS microphone inspired by the ears of the parasitoid fly, *Ormia ochracea*", in MEMS 2006: 19th IEEE International Conference on Micro Electro Mechanical Systems, Technical Digest, Proceedings: IEEE Micro Electro Mechanical Systems Workshop, 614-617 (2006), 19th IEEE International Conference on Micro Electro Mechanical Systems (MEMS 2006), Istanbul, TURKEY, Jan. 22-26, 2006.
5. B. Bicen, S. Jolly, K. Jeelani, C. T. Garcia, N. A. Hall, F. L. Degertekin, Q. Su, W. Cui, and R. N. Miles, "Integrated Optical Displacement Detection and Electrostatic Actuation for Directional Optical Microphones With Micromachined Biomimetic Diaphragms", IEEE Sensors Journal 9, 1933-1941 (2009).
6. W. Cui, R. N. Miles, and Q. Su, "The Design, Fabrication and Characterization Of A Novel Miniature Silicon Microphone Diaphragm", in NANOTECH Conference & Expo 2009, VOL 1, Technical Proceedings—NANOTECHNOLOGY 2009: Fabrication, Particles, Characterization, MEMS, Electronics and Photonics, edited by Laudon, M and Romanowicz, B, 432-435 (2009), Nanotech 2009 Conference, Houston, Tex., May 3-7, 2009.
7. R. N. Miles, Q. Su, W. Cui, M. Shetye, F. L. Degertekin, B. Bicen, C. Garcia, S. Jones, and N. Hall, "A low-noise differential microphone inspired by the ears of the parasitoid fly *Ormia ochracea*", Journal of the Acoustical Society of America 125, 2013-2026 (2009).
8. R. Miles, S. Sundermurthy, C. Gibbons, R. Hoy, and D. Robert, "Differential microphone", (2004), U.S. Pat. No. 6,788,796.
9. R. Miles, "High-order directional microphone diaphragm", (2005), U.S. Pat. No. 6,963,653.
10. R. Miles, "Comb sense capacitive microphone", (2009), US Patent App. 2009/0262958.
11. R. Miles and F. Degertekin, "Optical sensing in a directional mems microphone", (2010), U.S. Pat. No. 7,826,629.
12. R. Miles and W. Cui, "Robust diaphragm for an acoustic device", (2011), U.S. Pat. No. 7,876,924.
13. R. Miles, "Miniature non-directional microphone", (2011), U.S. Pat. No. 7,903,835.
14. H. Xie, Y. Pan, and G. Fedder, "A CMOS-MEMS mirror with curled-hinge comb drives", Microelectromechanical Systems, Journal of 12, 450-457 (2003).
15. A. Ferreira and S. Aphale, "A survey of modeling and control techniques for micro- and nanoelectromechanical systems", Systems, Man, and Cybernetics, Part C: Applications and Reviews, IEEE Transactions on 1-15 (2008).
16. F. Hu, Y. Tang, and Y. Qian, "Design of a mems micromirror actuated by electrostatic repulsive force", Optik-International Journal for Light and Electron Optics (2011).
17. S. Weber, L. Bonacina, W. Noell, D. Kiselev, J. Extermann, F. Jutzi, S. Lani, O. Nenadl, J. Wolf, and N. de Rooij, "Design, simulation, fabrication, packaging, and characterization of a mems-based mirror array for femtosecond pulse-shaping in phase and amplitude", Review of Scientific Instruments 82, 075106 (2011).
18. Y. Ma, S. Islam, and Y. Pan, "Electrostatic torsional micromirror with enhanced tilting angle using active control methods", Mechatronics, IEEE/ASME Transactions on 16, 994-1001 (2011).
19. D. Homentcovschi and R. Miles, "Modeling of viscous damping of perforated planar microstructures. Applications in acoustics", Journal of the Acoustical Society of America 116, 2939-2947 (2004).
20. D. Homentcovschi and R. Miles, "Viscous damping of perforated planar micromechanical structures", Sensors and Actuators A-Physical 119, 544-552 (2005).
21. D. Homentcovschi and R. N. Miles, "Viscous microstructural dampers with aligned holes: Design procedure including the edge correction", Journal of the Acoustical Society of America 122, 1556-1567 (2007).
22. D. Homentcovschi, W. Cui, and R. N. Miles, "Modelling of viscous squeeze-film damping and the edge correction for perforated microstructures having a special pattern of holes", in Proceedings of the ASME International Design Engineering Technical Conference and Information in Engineering Conference, VOL 1, PTS A-C, 1025-1033 (2008), ASME International Design Engineering Technical Conferences/Computers and Information in Engineering Conference, Las Vegas, Nev., Sep. 4-7, 2007.
23. D. Homentcovschi and R. N. Miles, "Analytical model for viscous damping and the spring force for perforated planar microstructures acting at both audible and ultrasonic frequencies", Journal of the Acoustical Society of America 124, 175-181 (2008).
24. W. Cui, R. N. Miles, and D. Homentcovsci, "The effect of shape and distribution of perforations on squeeze-film damping in parallel plate capacitors", in ASME 2009 International Design Engineering Technical Conferences and Computers and Information in Engineering Conference (IDETC/CIE2009), 663-670 (2010), ASME International Design Engineering Technical Conferences/Computers and Information in Engineering Conference, San Diego, Calif., Aug. 30-Sep. 2, 2009.
25. D. Homentcovschi and R. N. Miles, "Viscous damping and spring force in periodic perforated planar microstructures when the Reynolds' equation cannot be applied", Journal of the Acoustical Society of America 127, 1288-1299 (2010).
26. D. Homentcovschi, B. T. Murray, and R. N. Miles, "An analytical formula and FEM simulations for the viscous damping of a periodic perforated MEMS microstructure outside the lubrication approximation", Microfluidics and Nanofluidics 9, 865-879 (2010).
27. Cui, W. (2004). "Analysis, Design, and Fabrication of a Novel Silicon Microphone," Ph.D. Thesis, SUNY at Binghampton.
28. V. P. Jaecklin, C. Linder, N. F. de Rooij, and J. M. Moret, Micromechanical comb actuators with low driving voltage, J. Micromech. Microeng. 2 250-255, 1992.
29. Ki Bang Leea and Young-Ho Cho, A triangular electrostatic comb array for micromechanical resonant frequency tuning, Sensors and Actuators A: Physical Volume 70, Issues 1-2, 1 Oct. 1998, Pages 112-117.
30. Analog Devices, "ADXL05, +−1 g to +−5 g Single Chip Accelerometer with Signal Conditioning," Datasheet, 1995, Norwood, Mass. 02062.
31. Arjun Selvakumar, Farrokh Ayazi and Khalil Najafi, A High Sensitivity Z-Axis Torsional Silicon Accelerometer, Journal of Microelectromechanical Systems, June 1998, Volume 7, Issue 2, page(s): 192-200.

32. Rob Legtenberg, A W Groeneveld and M Elwenspoek, Comb-drive actuators for large displacements, J. Micromech. Microeng. 6 320-329, 1996.
33. Yongjun Zhao, Tianhong Cui, Fabrication of high-aspect-ratio polymer-based electrostatic comb drives using the hot embossing technique, 2003 J. Micromech. Microeng. 13 430-435.
34. M. Steven Rodgers, et al., "A New Class of High Force, Low-Voltage, Compliant Actuation Systems," Solid State Sensor and Actuator Workshop, Hilton Head Island, S.C., Jun. 4-8, 2000.
35. Chen Yang-Che, Chang Ian Chao-Min, Rongshun Chen, Hou Max Ti-Kuang, On the side instability of comb-fingers in MEMS electrostatic devices, Sensors and actuators. A, Physical ISSN 0924-4247, vol. 148, not, pp. 201-210, 2008.
36. B. Borovic, F. L. Lewis, A. Q. Liu, E. S. Kolesar, D. Popa, The lateral instability problem in electrostatic comb drive actuators: modeling and feedback control Export, Journal of Micromechanics and Microengineering, Vol. 16, No. 7. (July 2006), pp. 1233-1241.
37. Wei Huang, and Ganyu Lu, Analysis of lateral instability of in-plane comb drive MEMS actuators based on a two-dimensional model, Sensors and Actuators A: Physical Volume 113, Issue 1, 15 Jun. 2004, Pages 78-85.
38. Huikai Xie, and Gary K. Feddera, b, Vertical comb-finger capacitive actuation and sensing for CMOS-MEMS, Sensors and Actuators A: Physical Volume 95, Issues 2-3, 1 Jan. 2002, Pages 212-221.
39. Huikai Xie and Gary Fedder, A CMOS z-axis capacitive accelerometer with comb-finger sensing, Proceedings of the 13th IEEE International Conference on Micro Electro Mechanical Systems (MEMS '00), January, 2000, pp. 496-501.
40. Duck-Bong Seo, Robin Shandas, Design and simulation of a MEMS-based come-drive pressure sensor for pediatric post-operative monitoring applications, 2003 Summer Bioengineering Conference, June 25-29, Sonesta Beach Resort in Key Biscayne, Fla.
41. A. Mason, M. Oshinsky, and R. R. Hoy, "Hyperacute directional hearing in a microscale auditory system," Nature, 410, pp. 686-90, 2001.
42. R. N. Miles, D. Robert, and R. R. Hoy, "Mechanically Coupled Ears for Directional Hearing in the Parasitoid Fly *Ormia ochracea*," Journal of the Acoustical Society of America, 98, pp. 3059-3070, 1995.
43. W. Cui, R. N. Miles, Q. Su, "A Robust Miniature Silicon Microphone diaphragm," IFSA, Sensors & Transducers Journal (ISSN 1726-5479), Vol. 7, Special Issue "MEMS: From Micro Devices to Wireless Systems", October 2009, pp. 63-77.

What is claimed is:

1. A method of forming a micromechanical structure, comprising:
    etching at least one trench into a substrate;
    forming a sacrificial layer on the substrate and walls of the at least one trench;
    depositing a structural layer over the sacrificial layer, extending into the at least one trench;
    etching a peripheral boundary of a structure formed from the structural layer, wherein at least a portion of the structural layer overlying portions of the at least one trench is removed, and at least a portion of the structural layer extending into the at least one trench is preserved at the peripheral boundary, to thereby define a supporting member which extends across the peripheral boundary;
    etching a void through the substrate from beneath the structure in a rear etch step, the rear etch step exposing the sacrificial layer having higher residual compressive stresses than the structural layer; and
    removing at least a portion of the sacrificial layer, while preserving a portion of the structural layer over the removed at least a portion of the sacrificial layer, to create a fluid space separating the at least a portion of the sacrificial layer from the substrate, wherein at least a portion of the sacrificial layer formed on the walls of the at least one trench at the peripheral boundary is removed subsequent to removal of the portion of the sacrificial layer on the substrate beneath the structural layer not on the walls of the at least one trench at the peripheral boundary.

2. The method according to claim 1, wherein the portion of the structural layer separated from the substrate by a fluid space is flexibly supported by a narrow portion of the structural layer, and the at least one trench is formed proximate to the narrow portion, the sacrificial layer underlying the narrow portion being removed before the sacrificial layer on the walls of the at least one trench, such that the narrow portion remains held in position by the structural layer which extends into the at least one trench while the sacrificial layer underlying the structural layer in regions absent the at least one trench is removed before the sacrificial layer adjacent to the structural layer which extends into the at least one trench, the removing of the sacrificial layer proceeding until the structural layer which extends into the at least one trench is free to move into and out of the trench by a flexion of the narrow portion.

3. The method according to claim 2, wherein the substrate comprises silicon, and the sacrificial layer comprises silicon dioxide formed by oxidizing a surface of the silicon substrate.

4. The method according to claim 3, wherein the at least one trench comprises at least two trenches, having different depths, wherein the deeper trench is formed proximate to the narrow portion, to thereby support the narrow portion while the sacrificial layer on the walls of the shallower trench is removed.

5. The method according to claim 4, wherein the sacrificial layer is removed by dissolution of the silicon dioxide sacrificial layer in hydrofluoric acid.

6. The method according to claim 1, wherein the at least one trench is formed by reactive ion etching.

7. The method according to claim 1, wherein the interdigitated fingers have a depth greater than about ten times a thickness of the structural layer.

8. The method according to claim 1, wherein the at least one trench is provided as a pair of linear arrays of trenches to define a set of interdigitated fingers, said second etch frees a portion of the set of interdigitated fingers attached within the boundary to the structure to move with respect to a portion of the set of interdigitated fingers detached from the structure, and the sacrificial layer keeps the structure from being fully released after the rear etch.

9. The method according to claim 8, wherein the structure comprises a diaphragm of a microphone, which displaces in response to acoustic vibrations, wherein the diaphragm symmetrically pivots about a pair of narrow portions, to provide a directional acoustic response, and wherein the interdigitated fingers are conductive, thus forming a capacitive displacement sensor.

10. The method according to claim 8, wherein the sacrificial layer is formed by chemically converting the substrate to another composition, wherein the set of interdigitated fingers is defined by trenches formed sufficiently close, and conversion is conducted to completely convert a wall between adjacent trenches to the other composition and wherein the interdigitated fingers overly the void, and at least a portion of the set of interdigitated fingers is free to move toward and away from the void.

11. The method according to claim 1, wherein the at least one trench comprises a first set of trenches which define a set of stiffeners configured to stiffen the structure, and a second set of trenches, deeper that the first set of trenches, configured to define supports for the structure which are released from the substrate by removal of the sacrificial layer after the stiffeners are released from the substrate and respective ones of the first set of trenches intersect ones of the second set of trenches.

12. The method according to claim 11, further comprising defining third and fourth sets of trenches, configured to together form a set of interdigitated fingers, the third set of trenches defining a first set of fingers attached to the substrate, and the fourth set of trenches defining a second set of fingers attached to the structure and interleaved with the first set of fingers, and moveable with the structure with respect to the substrate, wherein the third set of trenches are deeper than the first set of trenches.

13. The method according to claim 1, wherein the sacrificial layer comprises an etch stop property which limits an extent of the rear etch.

14. The method according to claim 1, wherein a surface of the structure remains fixed to the substrate through the sacrificial layer until said removing is conducted.

15. The method according to claim 1, wherein the structural layer comprises polysilicon which covers the substrate and fills the at least one trench.

16. The method according to claim 1, wherein the rear etch comprises a through-wafer, deep reactive ion etch.

17. A method of forming a micromechanical structure, comprising:
    forming at least one trench having walls in a surface of a substrate during a first etch;
    forming a sacrificial oxide layer on the surface of the substrate and the walls of the at least one trench;
    depositing a polysilicon layer over the sacrificial oxide layer, extending onto the walls of the at least one trench;
    defining at least one supporting portion from the polysilicon layer in a second etch, by removing at least a portion of the polysilicon layer overlying portions of the at least one trench, while preserving the polysilicon layer on the walls of the at least one trench;
    backside etching the substrate to form a through hole to the sacrificial oxide layer beneath the at least one supporting portion; and
    removing at least a portion of the sacrificial oxide layer, while preserving a portion of the polysilicon layer spaced from the surface of the substrate by a fluid space formed where the sacrificial oxide layer is removed, wherein at least a portion of the sacrificial layer on the walls of the at least one trench is removed subsequent to removal of a portion of the sacrificial layer on the surface of the substrate,
    the formed micromechanical structure comprising:
    the substrate having a through hole;
    a residual portion of the sacrificial oxide layer peripheral to the through hole formed on the substrate; and
    the polysilicon layer overlying the through hole, patterned to have:
        a planar portion;
        the at least one supporting portion corresponding to the at least one trench, connecting the planar portion to a portion of the polysilicon layer on the residual portion of the sacrificial oxide layer peripheral to the through hole, the at least one supporting portion having a depth greater than a depth of the planar portion.

18. The method according to claim 17, wherein the at least one trench defines:
    a first pattern of polysilicon stiffeners formed extending beneath the planar portion overlying the through hole, configured to stiffen the planar portion; and
    a second pattern of polysilicon ribs selectively disposed surrounding the at least one supporting portion, attached near a periphery of the planar portion, wherein the polysilicon ribs extend from the planar portion to a depth beyond a depth of the polysilicon stiffeners, and extend laterally beyond an edge of the planar portion.

19. The method according to claim 18, wherein the polysilicon stiffeners intersect the polysilicon ribs.

20. The method according to claim 17, wherein at least a portion of the second pattern of polysilicon ribs is configured as a set of fingers which interdigitate with a corresponding set of fingers, formed of polysilicon, extending from a portion of the polysilicon layer on the residual portion of the sacrificial oxide layer peripheral to the hole, wherein the set of fingers moves in response to a force, by a flexion or torsion of the at least one supporting portion, relative to the corresponding set of fingers, out of a plane of the planar portion.

21. The method according to claim 20, wherein the set of fingers and the corresponding set of fingers are conductive and electrically isolated from each other, and are configured to act as a capacitive displacement sensor.

22. The method according to claim 20, wherein the set of fingers attached to the planar portion moves relative to the corresponding set of fingers in response to the force, generated by acoustic vibrations in air surrounding the planar portion.

23. The method according to claim 20, wherein the planar portion comprises a diaphragm of a directional microphone and is supported by a pair of opposed supporting portions, and about an axis defined by the pair of opposed supporting portions, in response to the force, generated by acoustic vibrations in air surrounding the planar portion.

24. A micromechanical structure, comprising a substrate having a through hole; a residual portion of a sacrificial oxide layer peripheral to the through hole formed on the substrate; and a polysilicon layer overlying the through hole, patterned to have: (a) a planar portion; (b) at least one supporting portion connecting the planar portion to a portion of the polysilicon layer on the residual portion of the sacrificial oxide layer peripheral to the through hole; (c) a first pattern of polysilicon stiffeners formed extending beneath the planar portion overlying the through hole, configured to stiffen the planar portion; and (d) a second pattern of polysilicon ribs selectively disposed surrounding the at least one supporting portion, attached near a periphery of the planar portion, wherein the polysilicon ribs extend from the planar portion to a depth beyond a depth of the polysilicon stiffeners, and extend laterally beyond an edge of the planar portion, formed by a method comprising:
    forming at least one trench having walls in a surface of the substrate during a first etch;
    forming the sacrificial oxide layer on the surface of the substrate and the walls of the at least one trench;
    depositing the polysilicon layer over the sacrificial oxide layer, extending onto the walls of the at least one trench;
    defining the at least one supporting portion from the polysilicon layer in a second etch, by removing at least a portion of the polysilicon layer overlying portions of the at least one trench, while preserving the polysilicon layer on the walls of the at least one trench;

forming a through hole beneath the at least one supporting portion; and removing at least a portion of the sacrificial oxide layer, while preserving a portion of the polysilicon layer spaced from the surface of the substrate by a fluid space formed where the sacrificial oxide layer is removed, wherein at least a portion of the sacrificial layer on the walls of the at least one trench is removed subsequent to removal of a portion of the sacrificial layer on the surface of the substrate.

\* \* \* \* \*